(12) United States Patent
Noguchi et al.

(10) Patent No.: US 7,042,095 B2
(45) Date of Patent: May 9, 2006

(54) SEMICONDUCTOR DEVICE INCLUDING AN INTERCONNECT HAVING COPPER AS A MAIN COMPONENT

(75) Inventors: Junji Noguchi, Hamura (JP); Tsuyoshi Fujiwara, Hamura (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/387,504

(22) Filed: Mar. 14, 2003

(65) Prior Publication Data

US 2003/0183940 A1    Oct. 2, 2003

(30) Foreign Application Priority Data

Mar. 29, 2002  (JP) ............... 2002-094351
Dec. 12, 2002  (JP) ............... 2002-361363

(51) Int. Cl.
*H01L 21/88* (2006.01)
*H01L 23/48* (2006.01)

(52) U.S. Cl. .......... 257/762; 257/750; 257/759; 257/751; 257/774; 257/773; 257/211; 257/208; 257/203; 257/207; 257/410; 257/760; 257/522; 257/788; 257/914

(58) Field of Classification Search ......... 257/758, 257/750, 759, 751, 774, 773, 211, 208, 203, 257/207, 410, 760, 522, 788, 914, 776, 775
See application file for complete search history.

(56) References Cited

U.S. PATENT DOCUMENTS

| | | | |
|---|---|---|---|
| 5,949,143 A | 9/1999 | Bang | |
| 6,159,845 A * | 12/2000 | Yew et al. | 438/637 |
| 6,211,057 B1 * | 4/2001 | Lin et al. | 438/619 |
| 6,214,719 B1 * | 4/2001 | Nag | 438/619 |
| 6,268,277 B1 | 7/2001 | Bang | |
| 6,281,585 B1 * | 8/2001 | Bothra | 257/758 |
| 6,287,979 B1 | 9/2001 | Zhou et al. | |
| 6,300,242 B1 * | 10/2001 | Ueda et al. | 438/638 |
| 6,342,722 B1 | 1/2002 | Armacost et al. | |
| 6,399,476 B1 * | 6/2002 | Kim et al. | 438/619 |
| 6,403,461 B1 | 6/2002 | Tae et al. | |
| 6,406,992 B1 | 6/2002 | Mao et al. | |
| 6,407,360 B1 * | 6/2002 | Choo et al. | 219/121.67 |
| 6,492,732 B1 * | 12/2002 | Lee et al. | 257/758 |
| 6,633,082 B1 * | 10/2003 | Oda et al. | 257/750 |
| 2002/0013062 A1 * | 1/2002 | Shimizu et al. | 438/723 |
| 2002/0158337 A1 | 10/2002 | Babich et al. | |
| 2003/0077893 A1 * | 4/2003 | Demolliens et al. | 438/622 |

FOREIGN PATENT DOCUMENTS

JP  2000-262554  3/2001

* cited by examiner

*Primary Examiner*—Alexander Oscar Williams
(74) *Attorney, Agent, or Firm*—Antonelli, Terry, Stout and Kraus, LLP.

(57) ABSTRACT

Provided are a semiconductor device comprising a semiconductor substrate, a first insulating film formed thereover, interconnects formed over the first insulating film and having copper as a main component, a second insulating film formed over the upper surface and side surfaces of each of the interconnects and over the first insulating film and having a function of suppressing or preventing copper diffusion, and a third insulating film formed over the second insulating film and having a dielectric constant lower than that of the second insulating film; and a method of manufacturing the semiconductor device. This invention makes it possible to improve dielectric breakdown strength between copper interconnects and reduce capacitance between the copper interconnects.

9 Claims, 19 Drawing Sheets

17 : INSULATING FILM  26 : INSULATING FILM
20 : INSULATING FILM  27 : VOID
25 : INTERCONNECT    28 : INSULATING FILM

SEMICONDUCTOR DEVICE INCLUDING AN INTERCONNECT HAVING COPPER AS A MAIN COMPONENT

BACKGROUND OF THE INVENTION

The present invention relates to a semiconductor device and a method of manufacturing the same, particularly to a technique effective when applied to a semiconductor device having an interconnect containing a main conductor film having copper as a main component.

An inlaid interconnect structure is formed by embedding an interconnect material in an interconnect opening such as groove or recess formed in an insulating film by a metallization fabrication technique called damascene technique (single damascene or dual damascene technique). When a main interconnect material is copper (Cu), however, it tends to be diffused in an insulating film compared with a metal such as aluminum (Al) so that diffusion of copper in an inlaid interconnect into an insulating film is suppressed or prevented by covering the surfaces (bottom and side surfaces) of the inlaid interconnect with a thin barrier metal film in order to avoid direct contact of the inlaid interconnect made of copper with the insulating film. In addition, by forming an interconnect cap barrier insulating film made of, for example, a silicon nitride film, and covering therewith the upper surface of the inlaid interconnect, diffusion of copper in the inlaid interconnect into the insulating film from the upper surface of the inlaid interconnect is suppressed or prevented.

In recent years, such inlaid interconnects are narrowly spaced, reflecting an increase in the integration density of a semiconductor device. This increases the parasitic capacitance between interconnects and causes signal delay, which forms cross talk between two adjacent interconnects. A reduction in the parasitic capacitance between interconnects is therefore desired. For reducing the parasitic capacitance between interconnects, low dielectric constant materials are used for an interlayer dielectric film. For example, disclosed in Japanese Patent Application Laid-Open No. 2001-85519 is a technique of forming interconnects to have a reverse taper shape and forming an interlayer dielectric film to form an air gap in the space between these interconnects. This air gap is formed to reduce the interconnect capacitance.

SUMMARY OF THE INVENTION

According to the investigation results, the present inventors found that the above-described technique of forming an inlaid interconnect having copper as a main component involves the following problems.

When copper is used as an interconnect material, the TDDB (Time Dependence on Dielectric Breakdown) life becomes markedly shorter compared with the use of the other metal materials (such as aluminum and tungsten). Moreover, in addition to the trend toward scale-down of interconnect pitch and increase in effective field intensity, there is a recent tendency to use, as an interlevel insulating film, an insulating material having a lower dielectric constant than that of silicon oxide from the viewpoint of decreasing the interconnect capacitance. Since the low dielectric constant insulating film is generally low also in dielectric breakdown strength, there is still more difficulty in securing the TDDB life.

A deterioration in the TDDB life is presumed to occur because diffusion of copper used as an interconnect material lower the dielectric breakdown strength between interconnects. No consideration is paid for the barrier metal film and barrier insulating film in the above-described Japanese Patent Application Laid-Open No. 2001-85519. Even if the interconnect capacitance can be lowered by the air gap of the interlevel insulating film, copper used as the interconnect material diffuses in the interlevel insulating film and decreases the TDDB life. In addition, the air gap is formed by forming the interconnect to have a reverse taper shape so that the electric field concentrates on the upper end portion of the interconnect, thereby causing a further reduction in the TDDB life.

An object of the present invention is to provide a semiconductor device capable of improving the dielectric breakdown strength between interconnects having copper as a main conductor layer, and a method of manufacturing the same.

Another object of the present invention is to provide a semiconductor device capable of reducing the interconnect capacitance having copper as a main conductor layer, and a method of manufacturing the same.

The above-described and the other objects, and novel features of the present invention will become apparent from the description herein and accompanying drawings.

Among the inventions disclosed by the present application, typical ones will next be described briefly.

A semiconductor device according to the present invention comprises: a semiconductor substrate; a first insulating film formed thereover; interconnects formed over the first insulating film and having copper as a main component; a second insulating film formed over the upper and side surfaces of each of the interconnects and over the first insulating film and having a function of suppressing or preventing copper diffusion; and a third insulating film formed over the second insulating film and having a dielectric constant lower than that of the second insulating film.

A manufacturing method of a semiconductor device according to the present invention comprising the steps of: preparing a semiconductor substrate; forming thereover a first insulating film; forming thereover interconnects each having copper as a main component; forming a second insulating film having a function of suppressing or preventing copper diffusion over the upper surface and side surfaces of each of the interconnects and over the first insulating film without filling a material of the second insulating film between any two adjacent interconnects; and forming, over the second insulating film, a third insulating film having a dielectric constant lower than that of the second insulating film.

DETAILED DESCRIPTION OF THE PREFERRED EMBODIMENTS

Figure 1:
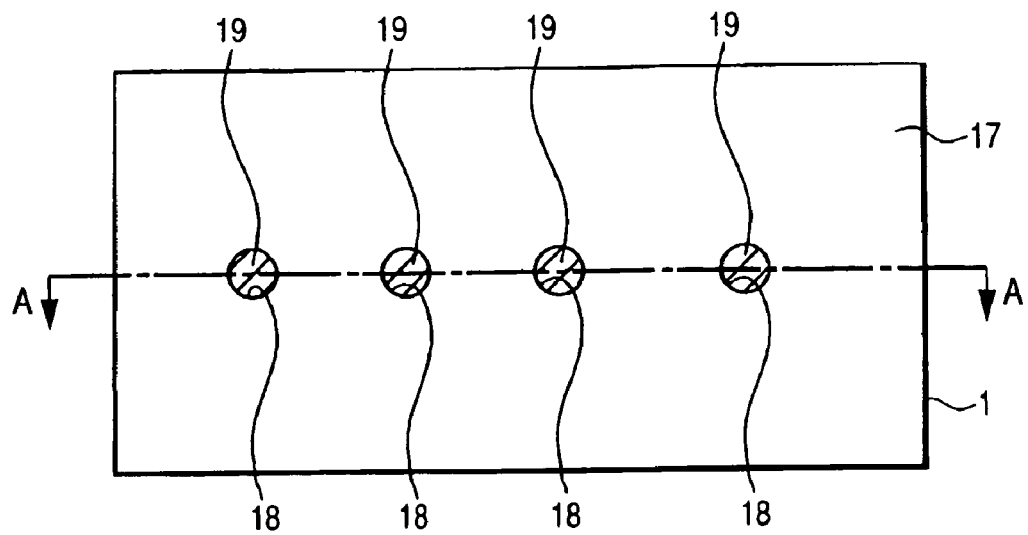
FIG. 1 is a fragmentary plan view of a semiconductor device according to Embodiment 1 of the present invention in a manufacturing step thereof.

Embodiments of the present invention will hereinafter be described in detail based on accompanying drawings. In all the drawings for describing the below-described embodiments, members having like function will be identified by like reference numerals and overlapping descriptions will be omitted. In the below-described embodiments, description of the same or similar parts are not repeated in principle unless otherwise necessary.

Embodiment 1

First, a causes for deteriorating the TDDB life between the inlaid interconnects each having copper as a main conductor layer, which have been investigated by the present inventors, will be described. The term "TDDB (Time Dependence on Dielectric Breakdown) life" is a measure for objectively measuring time-dependence of dielectric breakdown and means time (life) determined by extrapolation to an electric field intensity in actual use (e.g. 0.2 MV/cm) from a graph prepared by applying a comparatively high voltage to between electrodes under a measuring condition at a predetermined temperature (e.g. 140° C.) to plot a time from voltage application up to dielectric breakdown against an applied electric field.

A deterioration in the TDDB life is presumed to occur because copper employed as an interconnect material diffuses around and lowers dielectric breakdown strength between interconnects. Investigation results by the present inventors however suggest that this diffusion phenomenon of copper owes mainly to the following factors: First, copper which diffuses in an insulating film between two adjacent interconnects may be, rather than atomic copper, ionized copper which is fed from copper oxide (CuO) or copper silicide and drifting and diffusion of this ionized copper caused by the electric potential between interconnects become a dominant factor. Second, a main diffusion route of copper is an interface between the insulating film in which a copper interconnect has been formed and an interconnect cap film. From these findings, it has been understood that a deterioration in the TDDB life owes to the following mechanism.

Over the surface of an inlaid interconnect having copper as a main conductor film, copper oxide (CuO) may be formed by the surface processing after CMP or copper silicide (Cu compound) may be formed upon formation of a cap film (silicon nitride film). Such copper oxide or copper silicide is ionized easier than pure copper. The ionized copper diffuses into an insulating film between interconnects, drifted by an electric field between the interconnects. The interface between an insulating film (silicon oxide film) in which the inlaid interconnects have been formed and the cap film (silicon nitride film) is discontinuous and lacks adhesiveness because of many CMP damages, organic substances or dangling bonds formed over the interface. Existence of such dangling bonds accelerates diffusion of copper ions and such copper ions are drifted and diffused along the interface. In other words, a leak path is formed on the interface between interconnects. Owing to leakage for long hours and thermal stress by electric current, a leak current flowing through this leak path shows an accelerated increase, leading to dielectric breakdown (lowering in the TDDB life). Such causes for the deterioration of the TDDB life are disclosed in Japanese Patent Application No. 226876/1999, 2000-104015 or 2000-300853 by the inventors of the present application.

In this Embodiment, an improvement in the TDDB characteristics is investigated by removing, from between the same-level interconnects, a CMP surface (a surface polished by CMP) which is an interface acting as the leak path. A reduction in parasitic capacitance between interconnects is also investigated.

The semiconductor device according to this embodiment and manufacturing steps thereof will next be described based on accompanying drawings. FIG. 1 is a fragmentary plan view of a semiconductor device according to one embodiment of the present invention, for example, CMISFET (Complementary Metal Insulator Semiconductor Field Effect Transistor), during its manufacturing step; and FIG. 2 is a cross-sectional view taken along a line A—A of FIG. 1.

Figure 2:
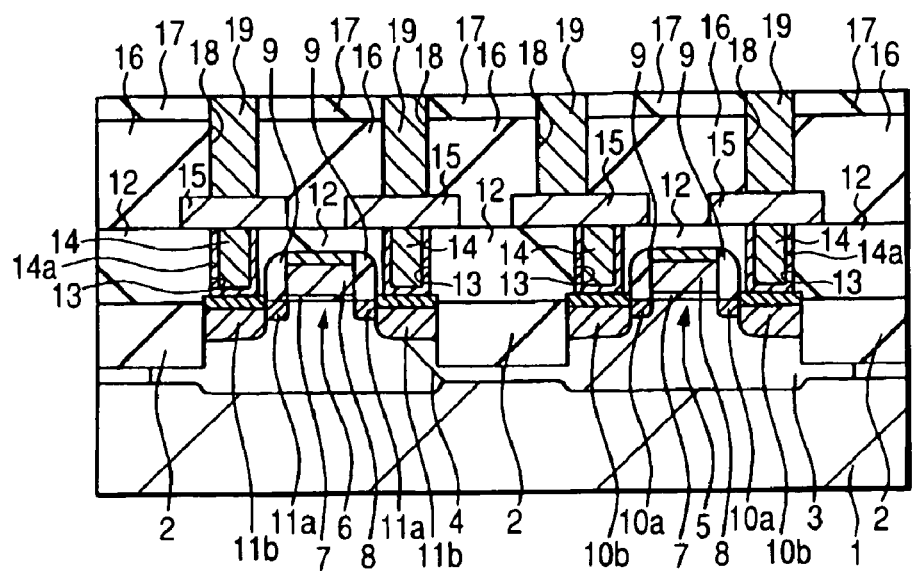
FIG. 2 is a cross-sectional view taken along a line A—A of FIG. 1.

As illustrated in FIGS. 1 and 2, a wafer or semiconductor substrate 1 having a specific resistance of about 1 to 10 Ωcm and formed of p type single crystal silicon has, over the main surface thereof, an isolation region 2. The isolation region 2 is made of, for example, silicon oxide and is formed, for example, by STI (Shallow Groove Isolation) or LOCOS (Local Oxidization of Silicon).

The semiconductor substrate 1 has a p type well 3 and n type well 4 formed over a predetermined depth from the main surface of the substrate. The p type well 3 is formed, for example, by ion implantation of an impurity such as boron, while the n type well 4 is formed, for example, by ion implantation of an impurity such as phosphorous.

In the region of the p type well 3, an n channel type MISFET 5 is formed in an active region surrounded by the isolation region 2. In the region of the n type well 4, a p channel type MISFET 6 is formed in an active region surrounded by the isolation region 2. The gate insulating film 7 of each of the n type MISFET 5 and p type MISFET 6 is made of, for example, a thin silicon oxide film and formed by thermal oxidation or the like method.

The gate electrode 8 of each of the n type MISFET 5 and p type MISFET 6 is formed by stacking, over a low resistance polycrystalline silicon film, a titanium silicide (TiSi$_x$) layer or cobalt silicide (CoSi$_x$) layer. Over the side walls of the gate electrode 8, side wall spacers or side walls 9 made of, for example, silicon oxide are formed.

The source and drain regions of the n type MISFET 5 has an LDD (Lightly Doped Drain) structure having an n$^-$ type semiconductor region 10a and an n$^+$ type semiconductor region 10b having a higher impurity concentration than that of the region 10a. The n$^-$ type semiconductor region 10a is formed, for example, by ion implantation of an impurity such as phosphorous into regions on both sides of the gate electrode 8 of the p type well 3 prior to the formation of side walls 9. The n$^+$ type semiconductor region 10b is formed, for example, by ion implantation of an impurity such as phosphorous into regions on both sides of the gate electrode 8 and side walls 9 of the p type well 3 after formation of the side walls 9.

The source and drain regions of the p type MISFET 6 is equipped with an LDD structure having a p$^-$ type semiconductor region 11a and a p$^+$ type semiconductor region 11b having a higher impurity concentration than that of the region 11a. The p$^-$ type semiconductor region 11a is formed, for example, by ion implantation of an impurity such as boron into regions on both sides of the gate electrode 8 of the n type well 4 prior to the formation of the side walls 9. The p$^+$ type semiconductor region 11b is formed, for example, by ion implantation of an impurity such as boron into regions on both sides of the gate electrode 8 and side walls 9 of the n type well 4 after formation of the side walls 9. Over a portion of the upper surface of the n$^+$ type semiconductor region 10b and p$^+$ type semiconductor region 11b, a silicide layer such as titanium silicide layer or cobalt silicide layer is formed.

Over such a semiconductor substrate 1, an insulating film 12 is formed to cover therewith the gate electrode 8 and side walls 9. The insulating film 12 is made of an insulating film having high reflow properties capable of embedding a narrow space between the gate electrodes 8, for example, a BPSG (Boron-doped Phospho Silicate Glass) film. In the insulating film 12, a contact hole 13 is formed. From the bottom of the contact hole 13, a portion of the main surface of the semiconductor substrate 1, for example, the n$^+$ type semiconductor region 10b and p$^+$ type semiconductor region 11b or the gate electrode 8 is exposed partially.

In the contact hole 13, a plug 14 made of tungsten (W) or the like has been formed. The plug 14 is formed, for example, by forming, as a barrier film, a titanium nitride film 14a over the insulating film 12 including the inside of the contact hole 13, depositing a tungsten film over the titanium nitride film 14a by CVD (Chemical Vapor Deposition) to embed the contact hole 13 with the tungsten film and then removing the unnecessary portions of the tungsten film and titanium nitride film 14a over the insulating film 12 by CMP (Chemical Mechanical Polishing) or etch back.

Over the insulating film 12 having the plug 14 embedded therein, a first-level interconnect 15 made of, for example, tungsten is formed. The first-level interconnect 15 is electrically connected, via the plug 14, to the semiconductor regions 10b and 11b for source•drain of each of the n type MISFET 5 and p type MISFET 6 and gate electrode 8. The material employed for the first-level interconnect 15 is not limited to tungsten but various materials are usable. Usable is a single film such as aluminum (Al) or aluminum alloy, or a laminated metal film having a metal film such as titanium (Ti) or titanium nitride (TiN) formed over at least one of the upper and lower layers of the above-described single film.

Over the insulating film 12, an insulating film 16 is formed to cover therewith the first-level interconnect 15. The insulating film 16 is made of, for example, a low dielectric constant material (so-called Low-K insulating film, Low-K material) such as organic polymer or organ-silica glass. As the low dielectric constant insulating film (Low-K insulating film), an insulating film having a lower dielectric constant than that of a silicon oxide film (for example, TEOS (Tetraethoxysilane) oxide film) contained in a passivation film can be given as an example. A TEOS oxide film has a specific dielectric constant ε of 4.1 to 4.2 so a film having a specific dielectric constant lower than it is generally called a low dielectric constant insulating film.

Examples of the organic polymer serving as the above-described low dielectric constant material include "SiLK" (product of The Dow Chemical Co./USA, specific dielectric constant: 2.7, heat resisting temperature: 490° C. or greater, dielectric breakdown strength: 4.0 to 5.0 MV/Vm) and "FLARE" (product of Honeywell Electronic Materials/USA, specific dielectric constant: 2.8, heat resisting temperature: 400° C. or greater) which is a polyallyl ether (PAE) material. This PAE material is characterized by high basic performances and excellent mechanical strength, heat stability and low cost performance. Examples of the organo-silica glass (SiOC material) serving as the above-described low dielectric constant material include "HSG-R7" (product of Hitachi Chemical, specific dielectric constant: 2.8, heat resisting temperature: 650° C.), "Black Diamond" (product of Applied Materials, Inc/USA, specific dielectric constant: 3.0 to 2.4, heat resisting temperature: 450° C.) and "p-MTES" (product of Hitachi Kaihatsu, specific dielectric constant: 3.2). Examples of the other SiOC material include "CORAL" (product of Novellus Systems, Inc/USA, specific dielectric constant: 2.7 to 2.4, heat resisting temperature: 500° C.), and "Aurora 2.7" (product of Nippon ASM, specific dielectric constant: 2.7, heat resisting temperature: 450° C.).

As the low dielectric constant material for the insulating film 16, FSG (SiOF material), HSQ (hydrogen silsesquioxane) material, MSQ (methyl silsesquioxane) material, porous HSQ material, porous MSQ material or porous organic material is also usable. Examples of the HSQ material include "OCD T-12" (product of Tokyo Oka Kogyo, specific dielectric constant: 3.4 to 2.9, heat resisting temperature: 450° C.), "FOx" (product of Dow Corning Corp./USA, specific dielectric constant: 2.9) and "OCL T-32" (product of Tokyo Oka Kogyo, specific dielectric constant: 2.5, heat resisting temperature: 450° C.). Examples of the MSQ material include "OCD T-9" (product of Tokyo Oka Kogyo, specific dielectric constant: 2.7, heat resisting temperature: 600° C.), "LKD-T200" (product of JSR, specific dielectric constant: 2.7 to 2.5, heat resisting temperature: 450° C.), "HOSP" (product of Honeywell Electronic Materials/USA, specific dielectric constant: 2.5, heat resisting temperature: 550° C.), "HSG-RZ25" (product of Hitachi Chemical, specific dielectric constant: 2.5, heat resisting temperature: 650° C.), "OCL T-31" (product of Tokyo Oka Kogyo, specific dielectric constant: 2.3, heat resisting temperature: 500° C.), and "LKD-T400" (product of JSR, specific dielectric constant: 2.2 to 2, heat resisting temperature: 450° C.). Examples of the above-described porous HSQ material include "XLK" (product of Dow Corning Corp. specific dielectric constant: 2.5 to 2), "OCLT-72" (product of Toko Oka Kogyo, specific dielectric constant: 2.2 to 1.9, heat resisting temperature: 450° C.), "Nanoglass" (product of Honeywell Electronic Materials, specific dielectric constant: 2.2 to 1.8, heat resisting temperature: 500° C. or greater) and "MesoELK" (product of Air Products and Chemicals, Inc./USA, specific dielectric constant: 2 or less). Examples of the porous MSQ material include "HSG-6211X" (product of Hitachi Chemical, specific dielectric constant: 2.4, heating temperature: 650° C.), "ALCAP-S" (product of Asahi Chemical, specific dielectric constant: 2.3 to 1.8, heat resisting temperature: 450° C.), "OCL T-77" (product of Tokyo Oka Kogyo, specific dielectric constant: 2.2 to 1.9, heat resisting temperature: 600° C.), "HSG-6210X" (product of Hitachi Chemical, specific dielectric constant: 2.1, heat resisting temperature: 650° C.) and "silica aerogel" (product of Kobe Steel, specific dielectric constant: 1.4 to 1.1). Examples of the porous organic material include "PolyELK" (product of Air Products and Chemicals, Inc./USA, specific dielectric constant: 2 or less, heat resisting temperature: 490° C.). The above-described SiOC materials and SiOF materials are formed, for example, by CVD. The above-described "Black Diamond" is formed, for example, by CVD using a mixed gas of trimethylsilane and oxygen. The above-described "p-MTES" is formed, for example, by CVD using a mixed gas of methyltriethoxysilane and $N_2O$. The other low dielectric constant insulating films are each formed, for example, by the coating method.

Over the insulating film made of such a Low-K material, an insulating film 17 for Low-K cap is formed. This insulating film 17 is made of, for example, a silicon oxide ($SiO_x$) film typified by silicon dioxide ($SiO_2$) and it functions, for example, to maintain the mechanical strength, protect the surface and maintain the moisture resistance of the insulating film 16 upon CMP treatment. The insulating film 17 is thinner than the insulating film 16 and is, for example, about 25 nm to 100 nm. The insulating film 17 is not limited to a silicon oxide film, and various films can be adopted as it. As the insulating film 17, a silicon nitride ($Si_xN_x$) film, silicon carbide (SiC) film or silicon carbonitride (SiCN) film may be used. The silicon nitride film, silicon carbide film or silicon carbonitride film can be formed, for example, by plasma CVD. The silicon carbide film formed by plasma CVD is, for example, "BLOk" (product of AMAT, specific dielectric constant: 4.3). Upon formation of the film, a mixed gas of trimethylsilane and helium (or $N_2$. $NH_3$) is used. The insulating films 16, 17 have, formed therein, a via or through-hole 18 from which the first-level interconnect 15 is partially exposed. In this through-hole 18, a plug 19 made of, for example, tungsten, is embedded.

Figure 3:
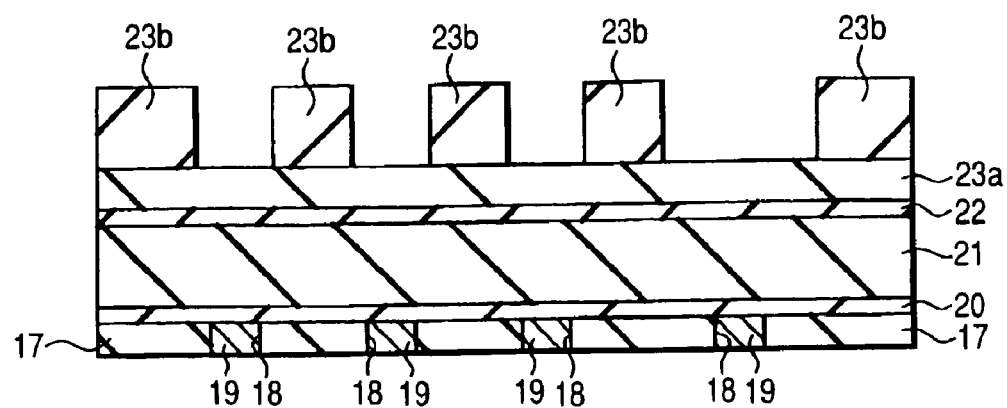
FIG. 3 is a fragmentary cross-sectional view of the semiconductor device during a manufacturing step following that of FIG. 2.
Figure 4:
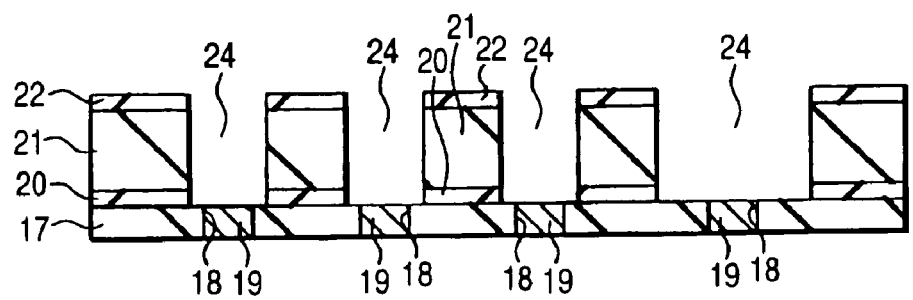
FIG. 4 is a fragmentary cross-sectional view of the semiconductor device during a manufacturing step following that of FIG. 3.
Figure 5:
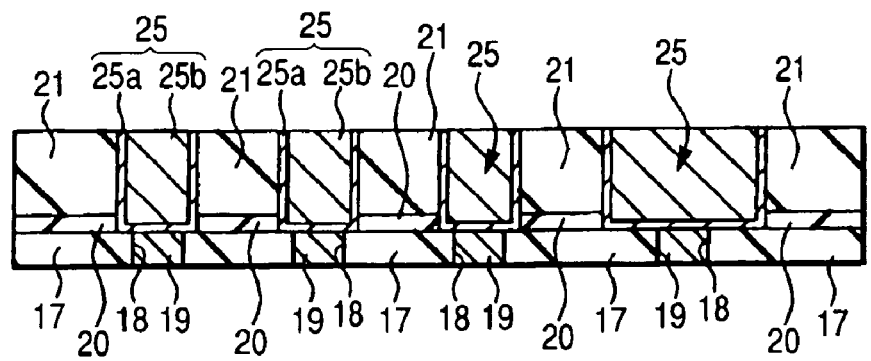
FIG. 5 is a fragmentary cross-sectional view of the semiconductor device during a manufacturing step following that of FIG. 4.

FIGS. 3 to 5 are fragmentary cross-sectional views of the semiconductor device in a manufacturing step following that of FIG. 2. In order to facilitate understanding, a part corresponding to the structure of FIG. 2, that is, the structure below the insulating film 17 is omitted.

In this Embodiment, as illustrated in FIG. 3, an insulating film 20 is formed by plasma CVD over the insulating film 17 in which the plug 19 has been buried. The insulating film 20 is made of, for example, a silicon nitride film formed by plasma CVD and it has a thickness of, for example, about 25 to 50 nm. As another material for the insulating film 20, usable is a single film such as silicon carbide film formed, for example, by plasma CVD, an SiCN film formed by plasma CVD or a silicon oxynitride (SiON) film formed by plasma CVD. Use of such a film can drastically lower a dielectric constant compared with the use of a silicon nitride film, making it possible to reduce the interconnect capacitance and improve the operation speed of a semiconductor device. The above-described "BLOk" (product of AMAT) is one example of the silicon carbide film formed by plasma CVD. Upon formation of the SiCN film, a mixed gas of helium (He), ammonia ($NH_3$) and trimethylsilane (3MS) is used. "PE-TMS" (product of Canon, dielectric constant: 3.9) is one example of the silicon oxynitride film formed by plasma CVD. Upon formation of it, a mixed gas of trimethoxysilane (TMS) gas and nitrogen oxide ($N_2O$) gas is employed for example.

Over the insulating film 20, an insulating film 21 is then formed. As described later, the insulating film 21 is preferably made of a material which can be etched by reducing plasma treatment, for example, $NH_3$ (ammonia) plasma treatment or $N_2/H_2$ plasma treatment. As the insulating film 21, therefore, the above-described Low-K material is usable. Since the insulating film 21 is finally removed, it does not need to have a low dielectric constant. Materials other than the Low-K material are also usable.

Over the insulating film 21, an insulating film 22 is formed. The insulating film 22 is a laminate film, for example, made of two layers, that is, a silicon nitride film, a silicon carbide film or a silicon carbonitride film, and a silicon oxide film thereover. To facilitate understanding, the insulating film 22 is illustrated as a single layer in the drawing. It is also possible to form the insulating film 22 as a single film made of any one of the above-described materials.

As illustrated in FIG. 3, antireflective film 23a and photoresist film are formed over the insulating film 22, followed by patterning the photoresist film by exposure to light, whereby photoresist patterns 23b are formed. By dry etching with the photoresist patterns 23b as an etching mask, the antireflective film 23a is selectively removed. By dry etching with the photoresist patterns 23b as an etching mask, the insulating film 22 is then removed selectively to form an opening portion. While the insulating film 21 exposed from the opening portion of the insulating film 22 is etched by $NH_3$ plasma treatment or $N_2/H_2$ plasma treatment, the photoresist patterns 23b and antireflective film 23a are removed by ashing. The insulating film 20 exposed from the opening portion of the insulating films 21 and 22 are removed by dry etching, whereby an opening portion or interconnect groove 24 is formed as illustrated in FIG. 4. From the bottom surface of the interconnect groove 24, the upper surface of the plug 19 is exposed. Alternatively, by dry etching with the photoresist patterns 23b as an etching mask, the insulating films 20, 21 and 22 are removed selectively to form the opening portion or interconnect groove 24, followed by removal of the photoresist patterns 23b and antireflective film 23a.

A conductive barrier film (first conductor film) 25a as thin as about 50 nm, which is made of, for example, titanium nitride (TiN), is formed all over the main surface of the substrate 1 by sputtering or the like method. The conductive barrier film 25a functions, for example, to prevent diffusion of copper to be used for the formation of a main conductor film and to improve wettability of copper upon reflow of the main conductor film. As the material for such a conductive barrier film 25a, a refractory metal nitride such as tungsten nitride (WN) or tantalum nitride (TaN) which hardly reacts with copper can also be used instead of titanium nitride. Materials obtained by adding silicon (Si) to a refractory metal nitride, or refractory metals which do not easily react with copper such as tantalum (Ta), titanium (Ti), tungsten (W) and titanium tungsten (TiW) can also be used as the material for the conductive barrier film 25a.

Over the conductive barrier film 25a, a main conductor film (second conductor film) 25b which is relatively thick with a thickness of about 800 to 1600 nm and is made of copper is formed. The main conductor film 25b can be formed by using, for example, CVD, sputtering or plating method. The substrate 1 is then subjected to heat treatment, for example, in a non-oxidizing atmosphere (for example, hydrogen atmosphere) at about 475° C. to cause reflow of the main conductor film 25b, whereby copper is buried completely inside of the interconnect groove 24.

The main conductor film 25b, conductive barrier film 25a and insulating film 22 are then polished by CMP until the upper surface of the insulating film 21 is exposed, whereby as illustrated in FIG. 5, a second-level interconnect (interconnect) 25 made of the relatively thin conductive barrier film 25a and relatively thick main conductor film 25b is formed in the interconnect groove 24. The second-level interconnect 25 is electrically connected to the first-level interconnect 15 via the plug 19.

Figure 6:
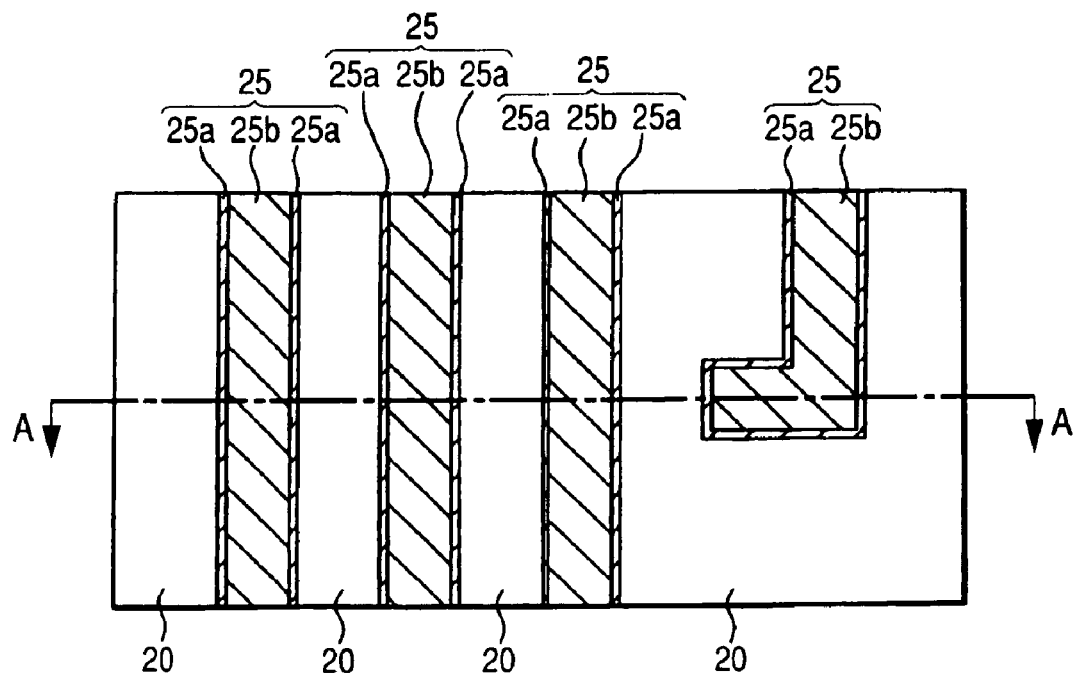
FIG. 6 is a fragmentary plan view of the semiconductor device during a manufacturing step following that of FIG. 5.
Figure 7:
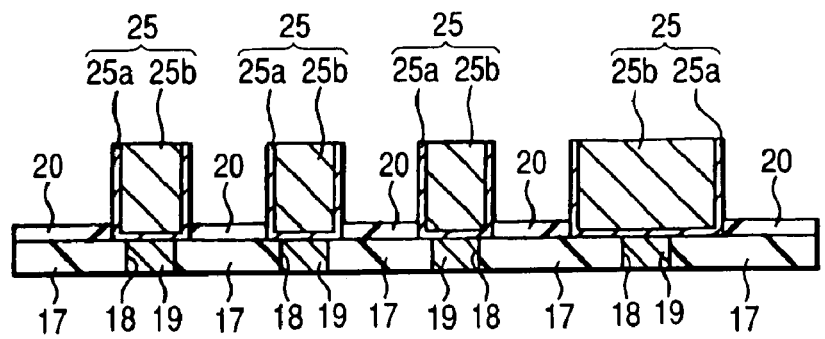
FIG. 7 is a cross-sectional view taken along a line A—A of FIG. 6.

FIG. 6 is a fragmentary plan view of a region of the semiconductor device corresponding to FIG. 1 in a manufacturing step following that of FIG. 5; and FIG. 7 is a cross-sectional view taken along a line A—A of FIG. 6. Also in FIG. 7, a part corresponding to the structure of FIG. 2, that is, the structure below the insulating film 17 is not illustrated.

After formation of the second-level interconnect (interconnect) 25 in the interconnect groove 24, the semiconductor substrate 1 is placed in the treatment chamber of a plasma CVD apparatus. An ammonia gas is introduced and a plasma power source is applied, whereby ammonia plasma treatment ($NH_3$) is given to the substrate 1 (particularly, the CMP surface from which the second-level interconnect 25 is exposed). Alternatively, an $N_2$ gas and $H_2$ gas are introduced to effect $N_2/H_2$ plasma treatment. By such reducing plasma treatment, copper oxide (CuO, $CuO_2$) on the surface of the copper interconnect oxidized by CMP is reduced to copper (Cu) and moreover, a copper nitride (CuN) layer is formed on the surface (markedly thin region) of the second-level interconnect 25. In addition, the insulating film 21 between the second level interconnects 25 is etched and removed by this plasma treatment. Thus, the structure as shown in FIGS. 6 and 7 is obtained. Accordingly, as the insulating film 21 used for the formation of the second-level interconnects 25, preferred is the use of a material easily etched by a treatment, such as reducing plasma treatment, which does not adversely affect the conductive barrier film 25a and the main conductor film 25b made of copper. When the insulating film 21 is removed by oxygen plasma treatment, copper over the second-level interconnects 25 is inevitably oxidized so that selective formation of the conductive barrier film over the second-level interconnects 25 is necessary. The second-level interconnect 25 has, for example, a strip-shaped plane as illustrated in FIG. 6.

The term "plasma treatment" means a treatment of exposing the surface of a substrate to an environment under plasma state or, if the substrate has a member such as an insulating film or a metal film formed thereover, exposing the surface of the member to such an environment, thereby giving chemical and mechanical (bombardment) actions of the plasma to the surface. The term "plasma of a reducing atmosphere" means a plasma environment wherein reactive species such as radicals, ions, atoms and molecules which have a reducing action, that is, an oxygen withdrawing action, exist dominantly.

Figure 8:
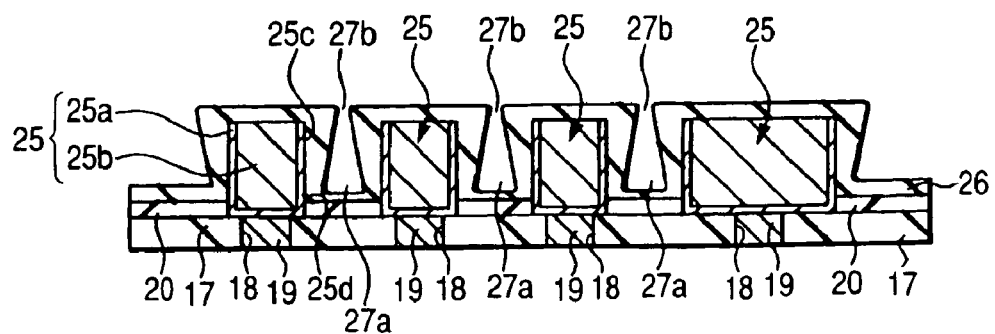
FIG. 8 is a fragmentary cross-sectional view of the semiconductor device during a manufacturing step following that of FIG. 7.

FIG. 8 is a fragmentary cross-sectional view of the semiconductor device during a manufacturing step following that of FIG. 7. Also in this FIG. 8, a part corresponding to the structure illustrated in FIG. 2, that is, the structure below the insulating film 17 is omitted.

After removal of the insulating film 21, cleaning is conducted, followed by the formation of an insulating film 26 all over the main surface of the semiconductor substrate 1 by plasma CVD or the like method as illustrated in FIG. 8. Described specifically, the insulating film 26 is formed over the insulating film 20 to cover the upper surface and side surfaces of each of the second-level interconnects 25. The insulating film 26 is made of, for example, a silicon nitride film, and it functions as a barrier insulating film of a copper interconnect. The insulating film 26 therefore suppresses or prevents diffusion of copper in the main conductor film of each of the second-level interconnects 25 into an interlevel insulating film 28 which will be formed later. As the insulating film 26, a single film such as silicon carbide (SiC) film, silicon carbonitride (SiCN) film or silicon oxynitride (SiON) film may be used instead. Use of such a film makes it possible to reduce a dielectric constant greatly compared with the use of a silicon nitride film, leading to a reduction in the interconnect capacitance and improvement in the operation speed of the semiconductor device. "BLOk" (product of AMAT) is one example of the silicon carbide film formed by plasma CVD. A gas used for its formation is as described above. Upon formation of the SiCN film, a mixed gas of helium (He), ammonia ($NH_3$) and trimethylsilane (3MS) is used for example. "PE-TMS" (product of Canon, dielectric constant: 3.9) is one example of the silicon oxynitride film formed by plasma CVD. Upon formation of the silicon oxynitride film, a mixed gas of trimethoxysilane (TMS) gas and nitrogen oxide ($N_2O$) gas is used for example.

In this embodiment, the insulating film 26 is formed under conditions so that the coverage between the most proximate interconnects (between two adjacent interconnects having a minimum distance therebetween, or between two adjacent interconnects having a minimum pitch therebetween) overhangs, in other words, under conditions so that the insulating film 26 is not formed conformal. The "most proximate interconnects" correspond to two adjacent interconnects of the same level, the distance between them (distance between two adjacent interconnects) is minimum. Between the most proximate interconnects, a reduction in parasitic capacitance has an important meaning.

As the deposition of the insulating film 26 proceeds, a deposit in the vicinity of the upper portion 25c on the opposite side surfaces of the two adjacent interconnects disturbs the smooth downflow of the reactive species. The deposition rate in the vicinity of a lower portion 25d on the opposite side surfaces of the interconnects therefore becomes smaller than that in the vicinity of the upper portion 25c, whereby the insulating film 26 deposited over the opposite side surfaces of the interconnects does not have a uniform thickness, more specifically, the insulating film becomes thicker in the vicinity of the upper portion 25c than in the vicinity of the lower portion 25d. Such a phenomenon is more marked between the most proximate interconnects of the second-level interconnects, more specifically, between the two adjacent interconnects which are most proximate among the second-level interconnects 25.

Figure 9:
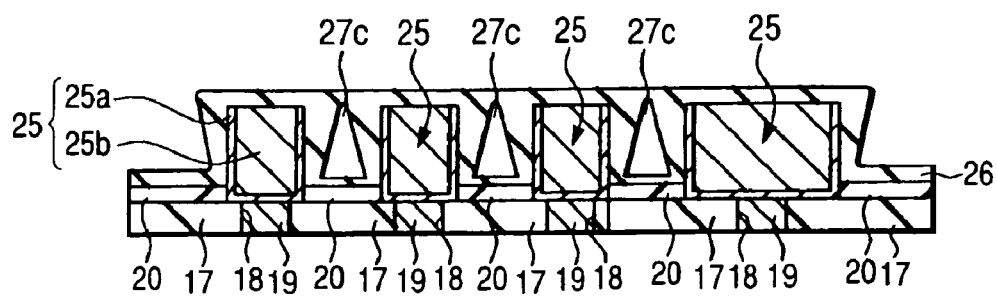
FIG. 9 is a fragmentary cross-sectional view of the semiconductor device during a manufacturing step following that of FIG. 7.

Between the most proximate interconnects of the second-level interconnects, the insulating film 26 does not reflect the shape of each second-level interconnect 25 and loses conformal shape. As illustrated in FIG. 8, a trench or concave 27a appears. The size of the upper opening portion 27b defined by the insulating film 26 is smaller than the inner size of the concave portion 27a. In other words, the distance of the concave portion 27a between the opposite inside walls (the surface of the insulating film 26) defined by the insulating film 26 becomes narrower toward the upper opening portion 27b. In FIG. 8, the cross-sectional shape of the concave portion 27a is illustrated only schematically. The concave portion 27a is able to have various cross-sectional shapes such as substantially oval shape. The insulating film 26 may be formed until the upper opening portion 27b of the concave portion 27a is closed. Alternatively, a space or void 27c having no material of the insulating film 26 therein may be formed in the insulating film of the most proximate interconnects of the second-level interconnects 25 as illustrated in FIG. 9 by forming the insulating film 26 until the upper opening portion 27b of the concave portion 27a and the opening portion of the unillustrated side (direction vertical to the paper of FIG. 8) is closed. In this embodiment, therefore, the material of the insulating film 26 is not completely filled between the most proximate interconnects of the second-level interconnects 25.

For the formation of the insulating film 26, a method such as plasma CVD can be employed. By controlling the forming conditions of the insulating film 26, the concave portion 27a as described above can be formed easily between the most proximate interconnects. It is not necessary to form the second-level interconnects 25 to have a reverse taper shape. In such a manner, the concentration of the electric field on the upper end portion of each second-level interconnect 25 can be relaxed.

In this Embodiment, the upper surface and side surfaces of each second-level interconnect 25 is covered with the insulating film serving as a barrier insulating film so that the second-level interconnect 25 can be formed only from the main conductor film 25b made of copper without forming the conductive barrier film 25a.

FIGS. 10 to 19 are fragmentary cross-sectional views of the semiconductor device during manufacturing steps following that of FIG. 8. Also in these FIGS. 10 to 19, a part corresponding to the structure illustrated in FIG. 2, that is, the structure below the insulating film 17 is omitted.

Figure 10:
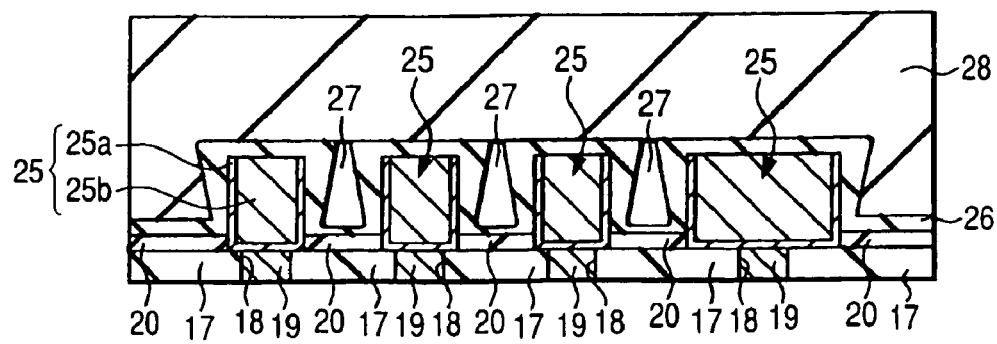
FIG. 10 is a fragmentary cross-sectional view of the semiconductor device during a manufacturing step following that of FIG. 8.

After formation of the insulating film 26, an insulating film 28 is formed thereover. In this embodiment, the insulating film 28 is formed so as not to completely fill the material of the insulating film 28 between the most proximate interconnects, in other words, so as not to completely fill the concave portion 27a as illustrated in FIG. 10. The insulating film 28 is made of the same material as the insulating film 16, that is, a Low-K material. As described above, the size of the upper opening portion 27b of the concave portion 27a defined by the insulating film 26 is smaller than the inner size of the concave portion 27a. When the insulating film 28 is formed, for example, by the coating method, the material of the insulating film 28 hardly enters into the concave portion 27a between the most proximate interconnects of the second-level interconnects 25 owing to the surface tension of the material. Accordingly, when the insulating film 28 is formed, a space or void 27 having therein neither the material of the insulating film 26 nor that of the insulating film 28 is formed. The void 27 is surrounded by the materials of the insulating films 26 and 28 and its inside may be vacuum or may contain gas components of the film forming atmosphere of the insulating film 28. On the other hand, when the distance between two adjacent interconnects of the second-level interconnects 25 is large, the material of the insulating film 28 is easily filled between the second-level interconnects so that no void 27 is formed. It is therefore possible to maintain mechanical strength.

When the insulating film 28 is formed by CVD, reactive species do not easily enter inside of the concave portion 27a of the insulating film 26 between the most proximate interconnects of the second-level interconnects 25. Within the concave portion 27a defined by the insulating film 26, the material of the insulating film 28 is hardly deposited and the void 27 is formed between the most proximate interconnects of the second-level interconnects 25.

FIG. 10 illustrates the insulating film 28 formed over the insulating film 26 while the concave portion 27a is formed in the insulating film 26 between the most proximate interconnects of the second-level interconnects 25 as illustrated in FIG. 8. When the insulating film 26 between the most proximate interconnects of the second-level interconnect 25 has the void 27c formed therein as illustrated in FIG. 9, the insulating film 28 is formed over the insulating film 26 without invasion of the material of the insulating film 28 in the void 27c in the insulating film 26. In such a manner, the space or void 27 free of the materials of the insulating films 26 and 28 is formed between the most proximate interconnects of the second-level interconnects 25.

The insulating film 28 is preferably formed of the above-described Low-K material in order to reduce parasitic capacitance between the upper-level interconnect (third-level interconnect 38 which will be described later) and the lower-level interconnect (second-level interconnect). Alternatively, the insulating film 28 may be formed, for example, from a silicon oxide film formed by CVD. The dielectric constant of the insulating film 28 is preferably lower than that of the insulating film 26 in order to reduce the parasitic capacitance between the upper-level interconnect and the lower-level interconnect.

Figure 11:
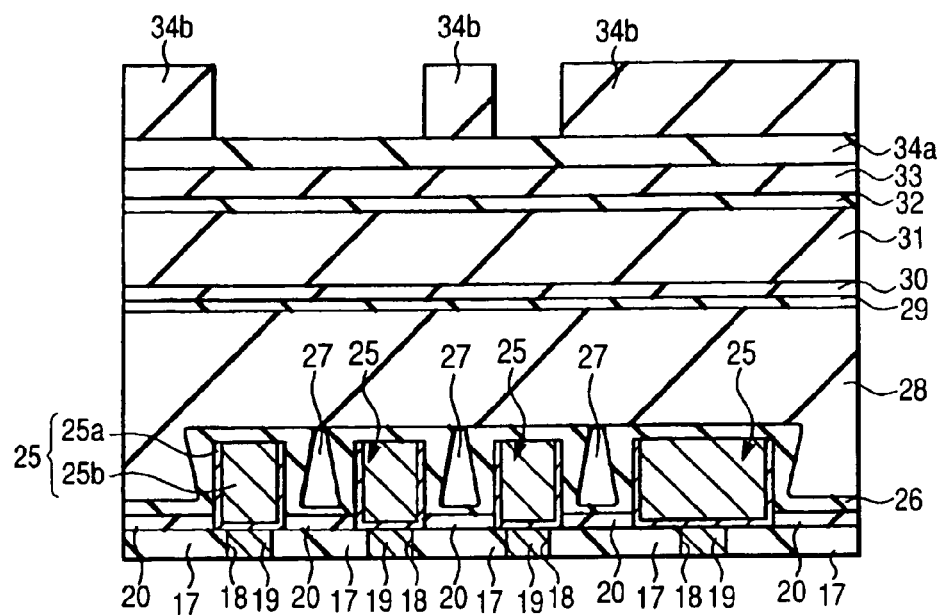
FIG. 11 is a fragmentary cross-sectional view of the semiconductor device during a manufacturing step following that of FIG. 10.

As illustrated in FIG. 11, insulating films 29 and 30 are formed over the insulating film 28 in this order by CVD. The insulating film 29 is made of, for example, a silicon nitride film, while the insulating film 30 is made of, for example, a silicon oxide film. CMP treatment is conducted if necessary to planarize the upper surface of the insulating film 30. As the other material for the insulating film 29, a silicon carbide film or SiCN film may be employed alternatively. As the material for the insulating film 30, silicon oxynitride (SiON) films such as "PE-TMS" (product of Canon, dielectric constant: 3.9) may be used alternatively. Formation of the insulating film 30 is not always required.

Over the insulating film 30, an insulating film 31 is formed. The insulating film 31 is preferably made of a material similar to that used for the insulating film 21, that is, a material which can be etched by reducing plasma treatment.

Over the insulating film 31, insulating films 32 and 33 are formed in this order. The insulating film 32 can be formed from a similar material to that employed for the formation of the insulating film 22. The insulating film 33 is made of, for example, a silicon nitride film. As the insulating film 33, a silicon carbide film or SiCN film may be employed alternatively.

Over the insulating film 33, an antireflective film 34a and a photoresist film are formed in this order. The photoresist film is then patterned by exposure to form photoresist patterns 34b, whereby a structure as illustrated in FIG. 11 can be obtained. By dry etching with the photoresist patterns 34b as an etching mask, the antireflective film 34a is selectively removed. By dry etching with the photoresist patterns 34b as an etching mask, the insulating film 33 is then selectively removed to form an opening portion 35. Upon formation of the opening portion 35, the insulating film 32 is caused to function as an etching stopper.

Figure 12:
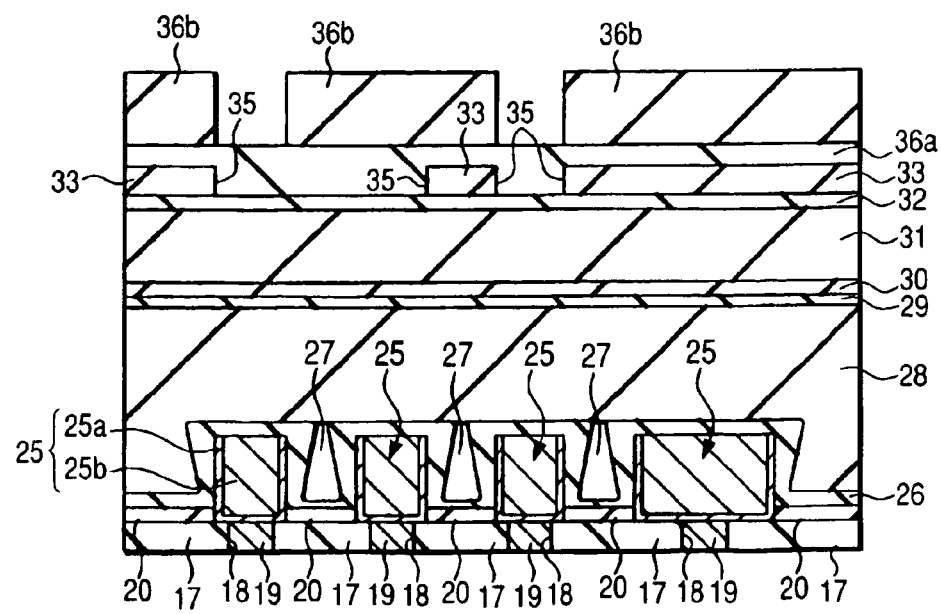
FIG. 12 is a fragmentary cross-sectional view of the semiconductor device during a manufacturing step following that of FIG. 11.

After removal of the remaining photoresist patterns 34b and antireflective film 34a, an antireflective film 36a is formed over the insulating film 33 including the inside of the opening portion 35. Over the antireflective film 36a, a photoresist film is formed. By exposure, the photoresist film is patterned to form photoresist patterns 36b, whereby a structure as illustrated in FIG. 12 is formed.

Figure 13:
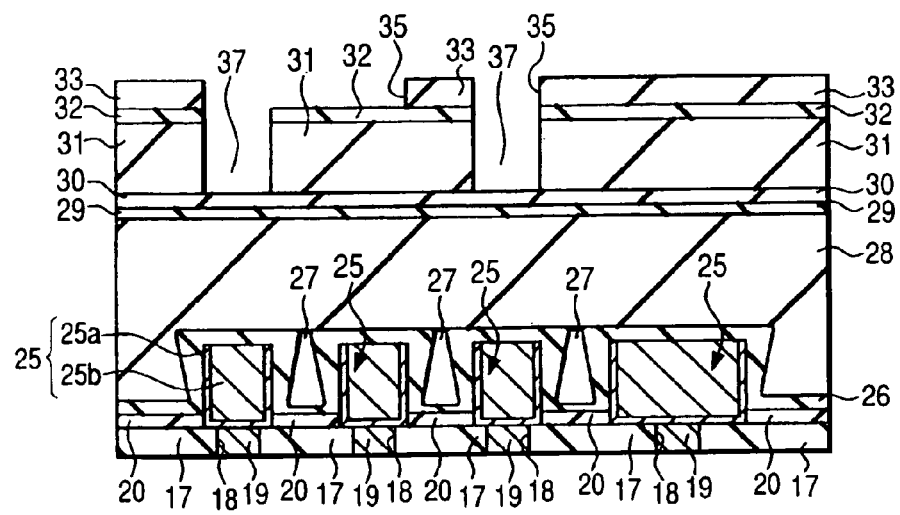
FIG. 13 is a fragmentary cross-sectional view of the semiconductor device during a manufacturing step following that of FIG. 12.

By dry etching with the photoresist patterns 36b as an etching mask, the antireflective film 36a is selectively removed. By dry etching with the photoresist patterns 36b as an etching mask, the insulating film 32 is then removed selectively to form an opening portion 37. From the bottom of the opening portion 37, the insulating film 31 is exposed. While the insulating film 31 exposed from the opening portion 37 is etched by $NH_3$ plasma treatment or $N_2/H_2$ plasma treatment, the photoresist patterns 36b and antireflective film 36a are removed by ashing, whereby a structure as illustrated in FIG. 13 can be obtained. Alternatively, the removal of the photoresist patterns 36b and antireflective film 36a can be carried out after etching of the insulating film 31.

Figure 14:
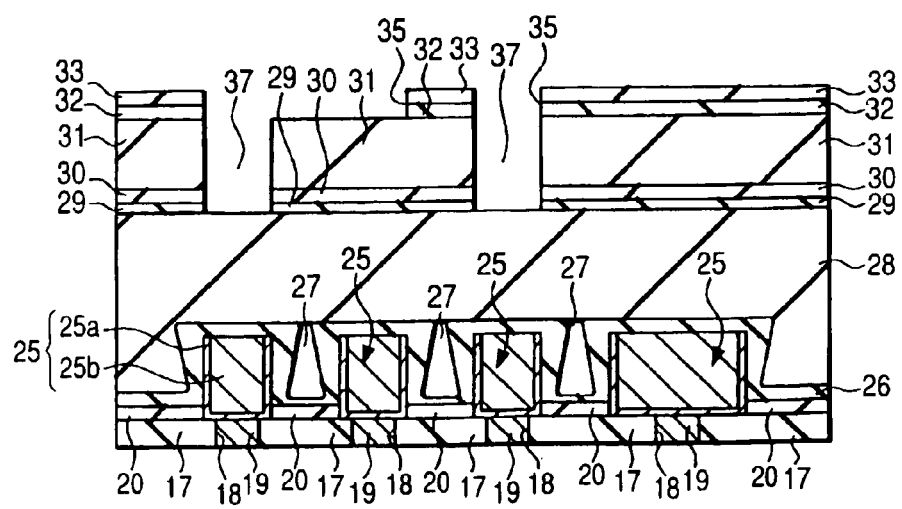
FIG. 14 is a fragmentary cross-sectional view of the semiconductor device during a manufacturing step following that of FIG. 13.

As illustrated in FIG. 14, the insulating film 30 exposed from the bottom of the opening portion 37, the insulating film 29 underlying the insulating film 30, and the insulating film 32 exposed from the opening portion 35 are removed by dry etching or the like method to expose the insulating film 28 and the insulating film 31 from the bottom of the opening portion 37 and opening portion 35, respectively. The insulating film 33 serving as an etching mask upon this removal loses the upper portion and becomes thin by etching, but it is not removed completely if it is formed relatively thick.

Figure 15:
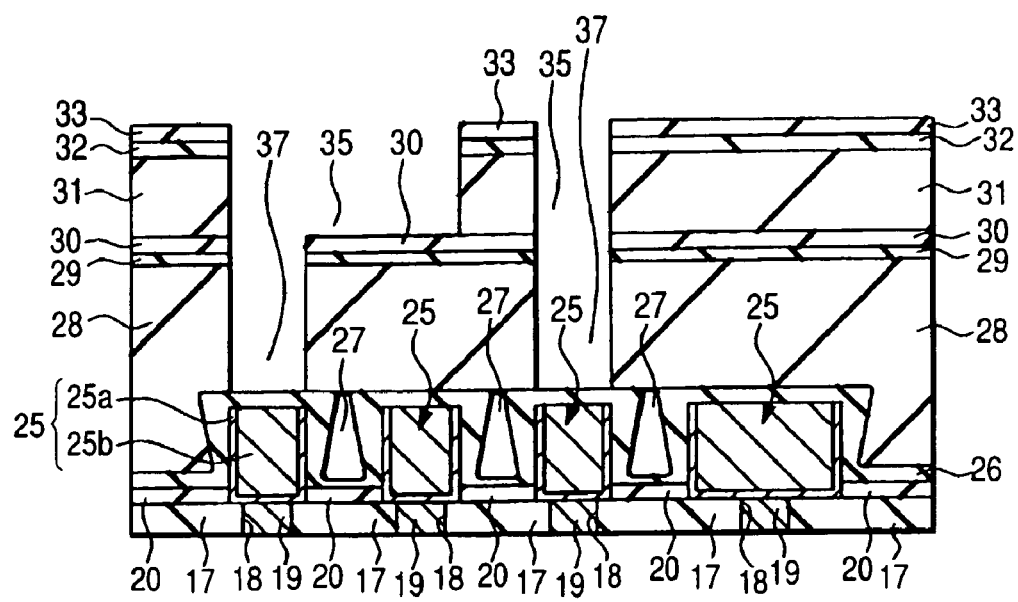
FIG. 15 is a fragmentary cross-sectional view of the semiconductor device during a manufacturing step following that of FIG. 14.

As illustrated in FIG. 15, the insulating film 28 exposed from the bottom of the opening portion 37 and the insulating film 31 exposed from the opening portion 35 are removed by dry etching or the like method. Upon this removal, the insulating film 33 serves as an etching mask, while the insulating films 26 and 30 serve as an etching stopper.

Figure 16:
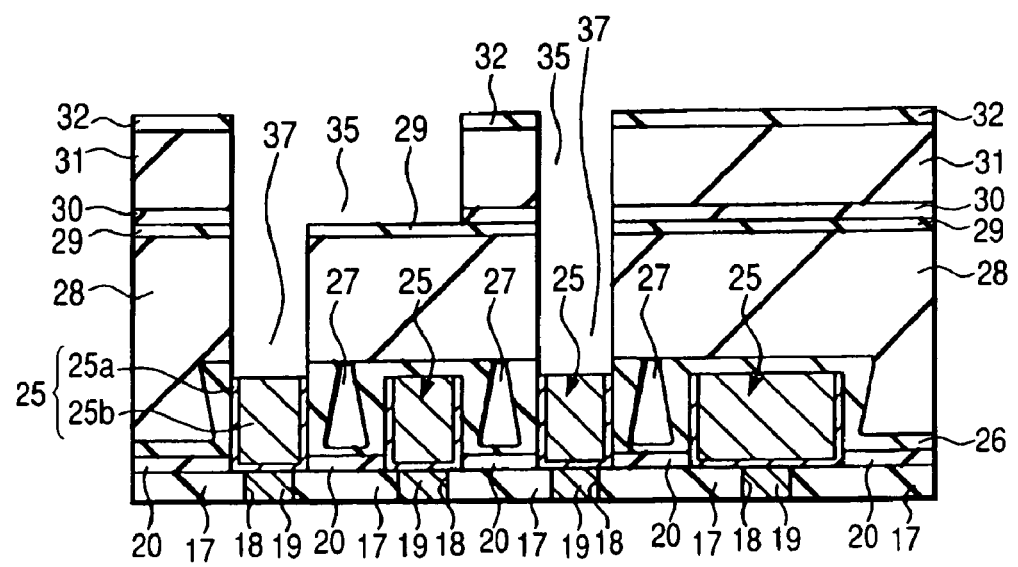
FIG. 16 is a fragmentary cross-sectional view of the semiconductor device during a manufacturing step following that of FIG. 15.

As illustrated in FIG. 16, the insulating film 26 exposed from the bottom of the opening portion 37 is removed by dry etching or the like method to expose the second-level interconnect 25 from the bottom of the opening portion 37. The insulating films 30 and 33 exposed are also removed simultaneously.

All over the main surface of the substrate 1, a conductive barrier film 38a made of a material similar to that employed for the formation of the conductive barrier film 25a, for example, titanium nitride is formed by sputtering or the like method. Then, a main conductor film 38b made of copper is formed, in a similar manner to that employed for the main conductor film 25b, over the conductive barrier film 38a so as to embed the opening portions 37 and 35.

Figure 17:
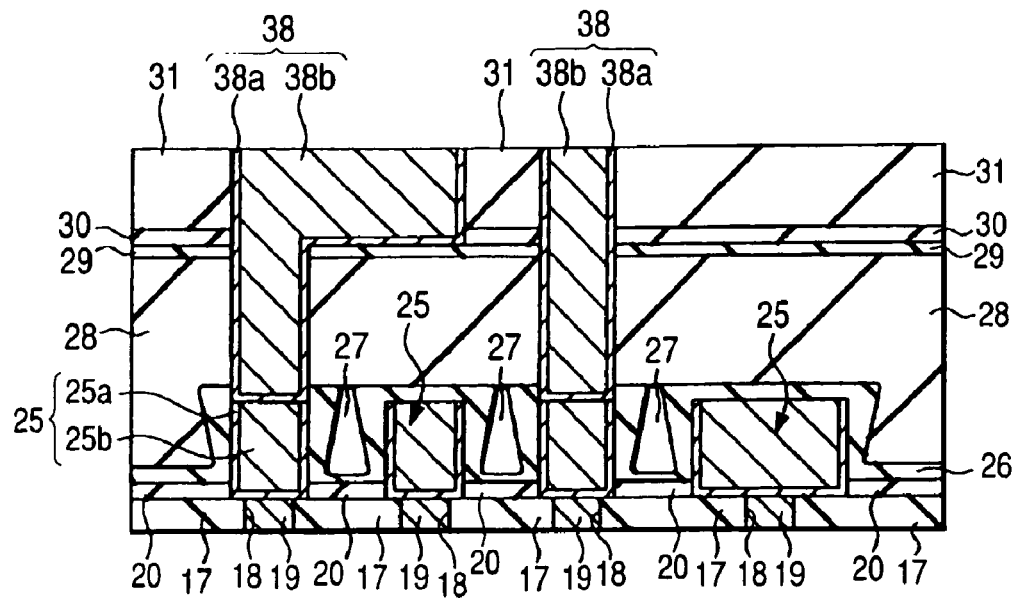
FIG. 17 is a fragmentary cross-sectional view of the semiconductor device during a manufacturing step following that of FIG. 16.

The main conductor film 38b, conductive barrier film 38a and insulating film 32 are polished by CMP until the upper surface of the insulating film 31 is exposed, whereby the third-level interconnect (interconnect) 38 is formed in the interconnect grooves made of the opening portions 35 and 37 as illustrated in FIG. 17. The third-level interconnect 38 has a relatively thin conductive barrier film 38a and a relatively thick main conductor film 38b and is electrically connected to the second-level interconnect 25.

Figure 18:
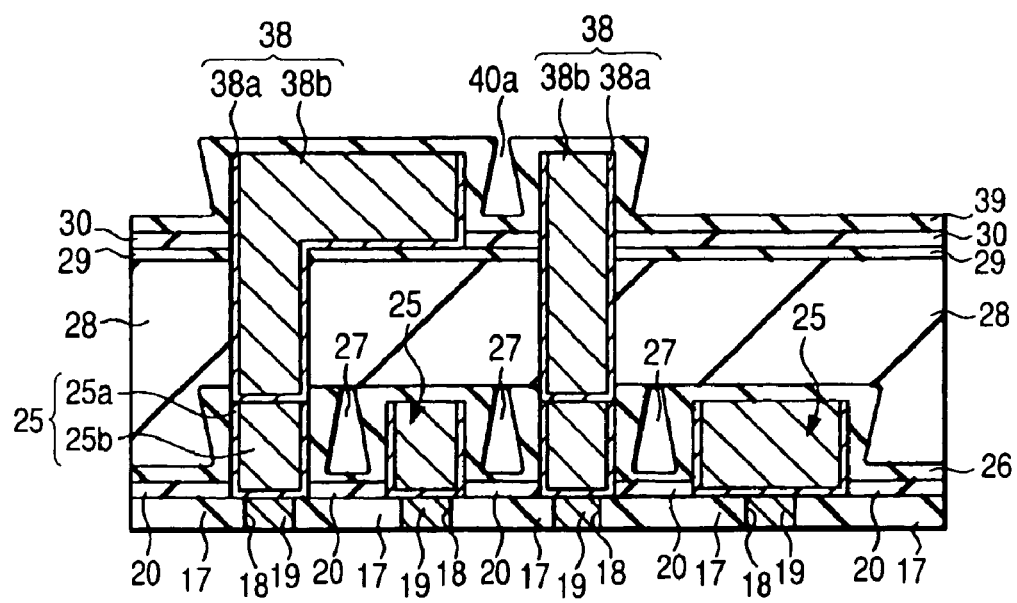
FIG. 18 is a fragmentary cross-sectional view of the semiconductor device during a manufacturing step following that of FIG. 17.

The insulating film 31 between the third-level interconnects 38 is then removed by a similar treatment to the plasma treatment conducted for removing the insulating film 21 between the second-level interconnects 25. An insulating film 39 serving as a barrier insulating film for the third-level interconnect 38 is then formed in a similar manner to that employed for the insulating film 26, whereby a concave portion 40a similar to the concave portion 27a appears between the most proximate interconnects of the third-level interconnects 38 as illustrated in FIG. 18.

Figure 19:
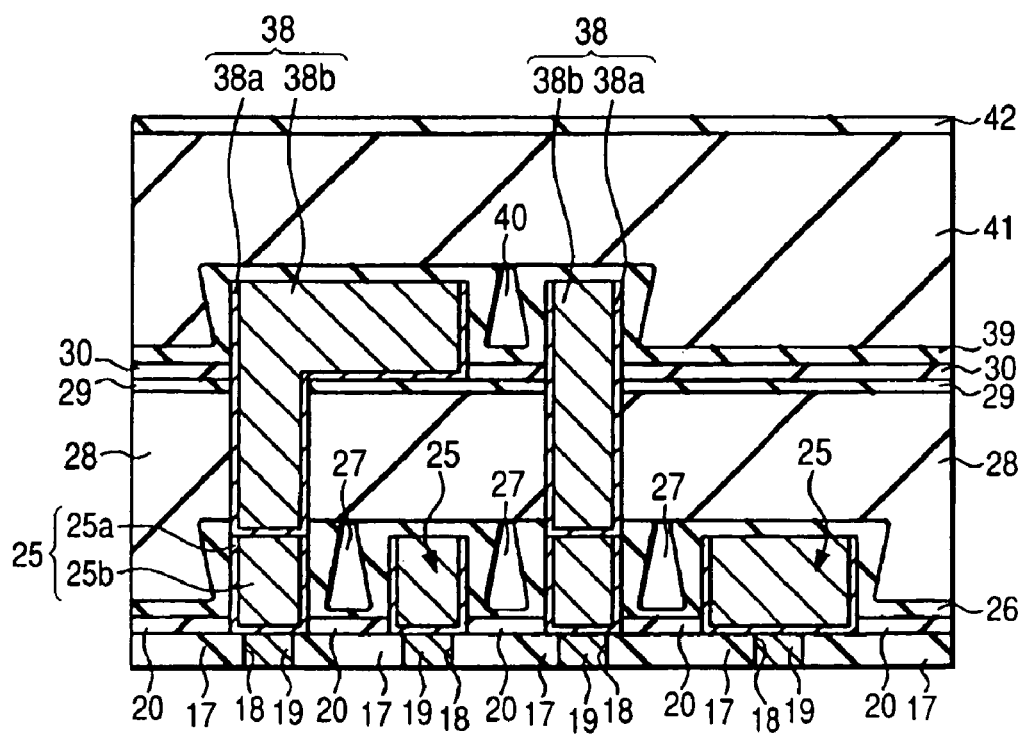
FIG. 19 is a fragmentary cross-sectional view of the semiconductor device during a manufacturing step following that of FIG. 18.

As illustrated in FIG. 19, an insulating film 41 made of a similar Low-K material similar to that employed for the formation of the insulating film 28 is formed over the insulating film 39. As in the formation of the insulating film 28, surface tension of the material for the insulating film 41 prevents it from entering inside of the concave portion 40a of the insulating film 39 between the most proximate interconnects of the third-level interconnects 38. When the insulating film 41 is formed, a space or void 40 is formed between the most proximate interconnects of the third-level interconnects 38. In a region where the distance between the two adjacent interconnects of the third-level interconnects 38 is large, the material for the insulating film 41 enters between the third-level interconnects 38 so that no void is formed, making it possible to maintain mechanical strength.

Over the insulating film 41, an insulating film 42 is then formed by CVD or the like method. The insulating film 41 is made of, for example, a silicon nitride film. CMP treatment is conducted, if necessary, to planarize the upper surface of the insulating film 41. As the material for the insulating film 41, a silicon carbide film, an SiCN film or a silicon oxynitride film is usable alternatively. In such a manner, a structure as illustrated in FIG. 19 can be obtained. A similar manufacturing step can be repeated, if necessary, to form upper interconnects higher in the level than the third-level interconnects. Alternatively, the first-level interconnects 15 may be formed as copper interconnects in a similar manner to that employed for the second-level interconnects 25, and the second-level interconnects 25 may be formed as copper interconnects in a similar manner to that employed for the third-level interconnects 38.

In this embodiment, no CMP surface (a surface polished by CMP) exists between any two of the same-level interconnects. Described specifically, the insulating films 21 and 31 polished upon CMP step, which has been carried out to form the second-level interconnects 25 and third-level interconnects 38, have been removed and the barrier insulating films 26 and 39 are formed to cover the second-level interconnects 25 and third-level interconnects 38, respectively. In each of the second-level interconnects 25 and the third-level interconnects 38, the upper surfaces of the same-level interconnects are never linked via the CMP surface, which makes it possible to improve the TDDB life and improve the dielectric breakdown strength between the interconnects, and in addition to heighten the reliability of the semiconductor device.

In addition, since the voids 27 and 40 free of a film material are formed between the most proximate interconnects of the same-level interconnects which needs capacitance decrease most, it is possible to reduce the interconnect capacitance. Even if a material having a relatively high dielectric constant is used for the barrier insulating films 26 and 39 for the interconnects, a reduction of the interconnect capacitance can be reduced.

When the distance between the two adjacent interconnects of the same-level interconnects is large, a Low-K material is formed without forming no voids between the interconnects. It is therefore possible to maintain the overall mechanical strength.

In this embodiment, the void 27 or 40 may be formed not only between the most proximate interconnects but also between two adjacent interconnects which have a relatively small distance therebetween and must be reduced in parasitic capacitance therebetween. By controlling the forming conditions of the insulating film 26 or 39, or forming conditions of the insulating film 28 or 41, it is possible to carry out void formation depending on the distance between the interconnects. In a region in which interconnect patterns are sparsely formed, a void is formed between two adjacent interconnects to reduce the interconnect capacitance, while in a region in which interconnect patterns are densely formed, a Low-K material is filled between the interconnects to maintain a mechanical strength.

The present inventors studied, by test and simulation, the capacitance reducing effect of the interconnect structure according to this embodiment. Used as a comparative example was a copper interconnect structure formed by the conventional damascene technique and having an insulating film and interlevel insulating film, for embedding therewith an interconnect groove, formed of a Low-K material.

As a result, the interconnect structure of this embodiment succeeded in decreasing the interconnect capacitance by about 20 to 30% compared with that of the comparative example. There was no large difference in the capacitance between the upper interconnect and lower interconnect and only the capacitance between the same-level interconnects showed a decrease. This made it possible to reduce the influence of cross talk of interconnects, and in addition to reduce an effective dielectric constant ∈r (∈r was about 3.1 in the copper interconnect structure of the above-described comparative example) greatly to about 2.3 to 2.7. Accordingly, a low capacitance interconnect structure of at least one generation ahead can be realized by using a Low-K material of the same generation as an interlevel insulating film.

Embodiment 2

FIGS. 20 to 25 are fragmentary cross-sectional views of the semiconductor device according to another embodiment of the present invention during its manufacturing steps. Manufacturing steps up to FIG. 10 are similar to those of Embodiment 1 so that a description on them is omitted and manufacturing steps following those of FIG. 10 will next be described.

Figure 20:
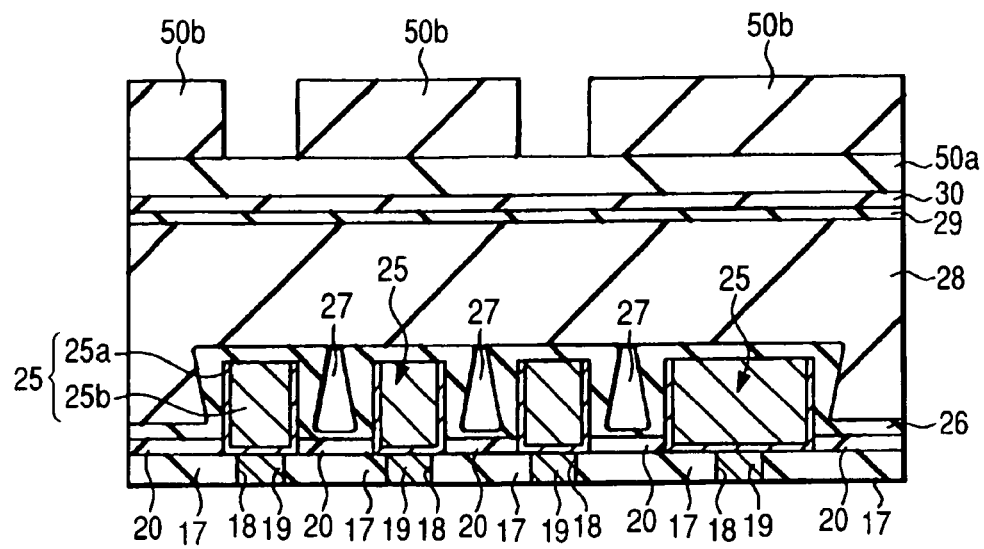
FIG. 20 is a fragmentary cross-sectional view of a semiconductor device according to Embodiment 2 of the present invention during a manufacturing step thereof.

After formation of the structure as illustrated in FIG. 10, an insulating film 29 made of, for example, a silicon nitride film, and an insulating film 30 made of, for example, a silicon oxide film are formed in this order over the insulating film 28 as illustrated in FIG. 20. CMP treatment is conducted if necessary to planarize the upper surface of the insulating film 30. It is not always necessary to form the insulating film 30.

Over the insulating film 33, an antireflective film 50a and a photoresist film are formed in this order, followed by patterning of the photoresist film by exposure, whereby photoresist patterns 50b are formed.

Figure 21:
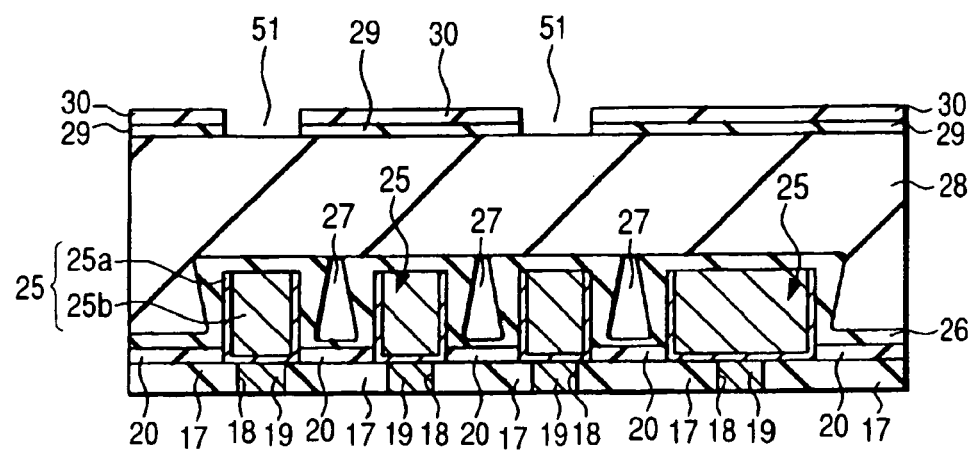
FIG. 21 is a fragmentary cross-sectional view of the semiconductor device during a manufacturing step following that of FIG. 20.

As illustrated in FIG. 21, by dry etching with the photoresist patterns 50b as an etching mask, the antireflective film 50a is selectively removed. By dry etching with the photoresist patterns 50b as an etching mask, the insulating films 29 and 30 are then selectively removed to form an opening portion 51. Upon formation of the opening portion 51, the insulating film 28 is caused to serve as an etching stopper. Then, the remaining photoresist patterns 50b and antireflective film 50a are removed.

Over the insulating film 30 including the inside of the opening portion 51, an insulating film 31 is formed. Over the insulating film 31, an insulating film 32 is then formed. Different from the above-described Embodiment 1, it is not always necessary to form an insulating film 33.

Figure 22:
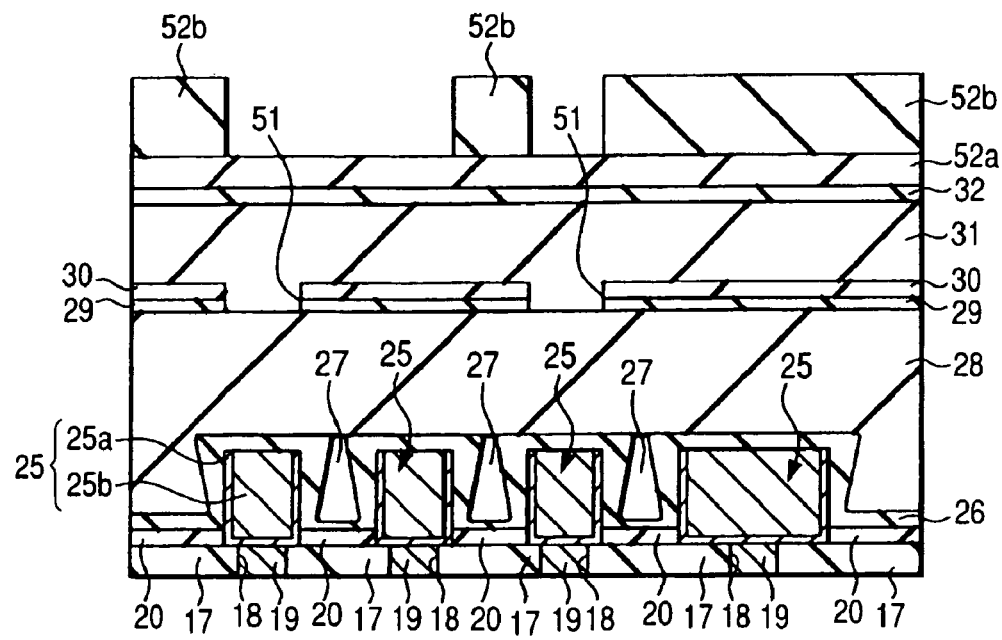
FIG. 22 is a fragmentary cross-sectional view of the semiconductor device during a manufacturing step following that of FIG. 21.

Over the insulating film 32, an antireflective film 52a is formed. A photoresist film is then formed over the antireflective film 52a and by patterning the photoresist film by exposure to form photoresist patterns 52b. In such a manner, a structure as illustrated in FIG. 22 is available.

Figure 23:
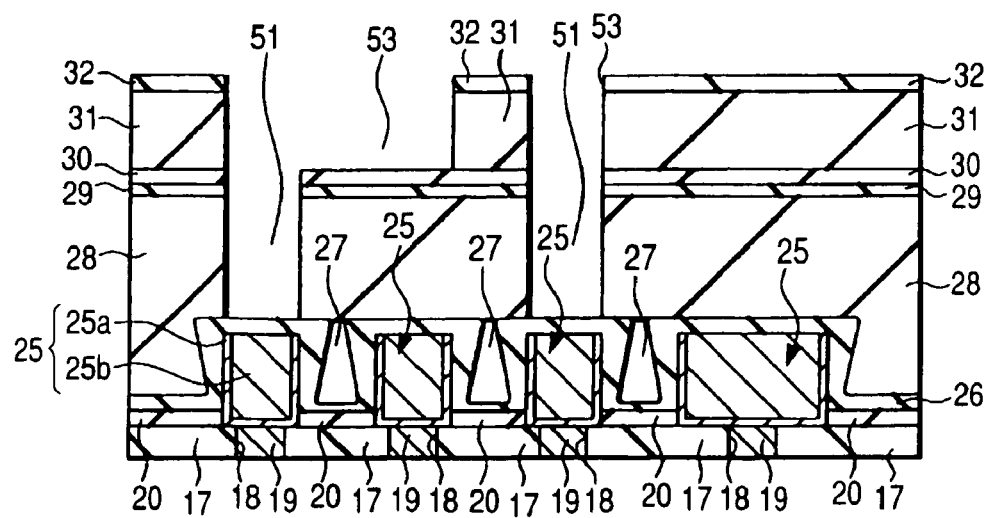
FIG. 23 is a fragmentary cross-sectional view of the semiconductor device during a manufacturing step following that of FIG. 22.

By dry etching with the photoresist patterns 52b as an etching mask, the antireflective film 52a is selectively removed. By dry etching with the photoresist patterns 52b as an etching mask, the insulating film 32 is then removed selectively to form an opening portion 53. From the bottom of the opening portion 53, the insulating film 31 is exposed. While the insulating film 31 exposed from the opening portion 53 and the insulating film 28 exposed from the opening portion 51 are etched by $NH_3$ plasma treatment or $N_2/H_2$ plasma treatment, the photoresist patterns 52b and antireflective film 52a are removed by ashing. Upon removal, the insulating film 26 and insulating film 30 function as an etching stopper. In such a manner, a structure as illustrated in FIG. 23 can be obtained. Alternatively, the photoresist patterns 52b and antireflective film 52a can be removed after etching of the insulating films 28 and 31.

Figure 24:
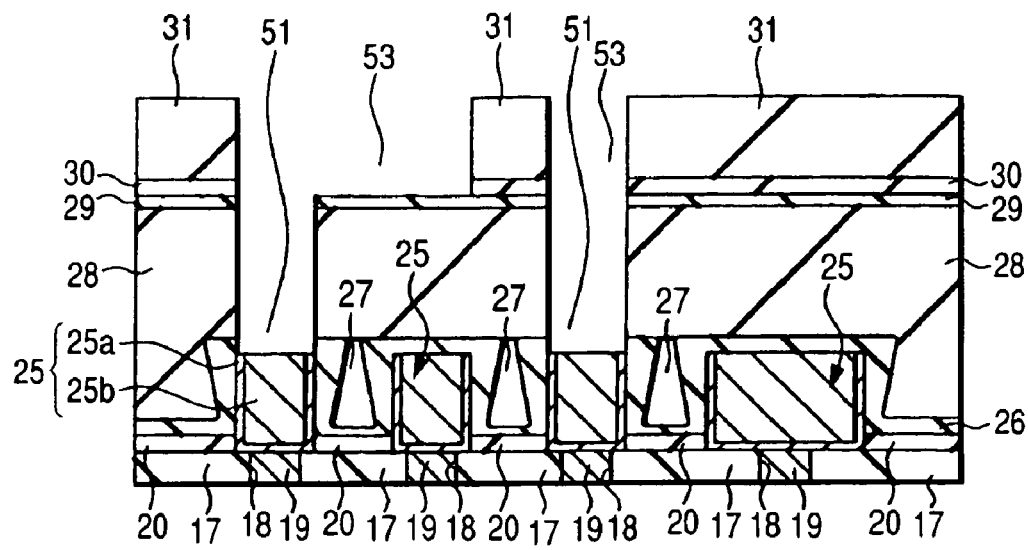
FIG. 24 is a fragmentary cross-sectional view of the semiconductor device during a manufacturing step thereof following that of FIG. 23.

As illustrated in FIG. 24, the insulating film 26 exposed from the bottom of the opening portion 51 is removed by dry etching or the like method to expose the second-level interconnect 25 from the bottom of the opening portion 51. By this etching, the exposed insulating films 30 and 32 can also be removed.

All over the main surface of the substrate 1, conductive barrier film 38a made of, for example, titanium nitride is formed by sputtering or the like method. Then, a main conductor film 38b made of copper is formed over the conductive barrier film 38a, with which the opening portions 51 and 53 are embedded.

Figure 25:
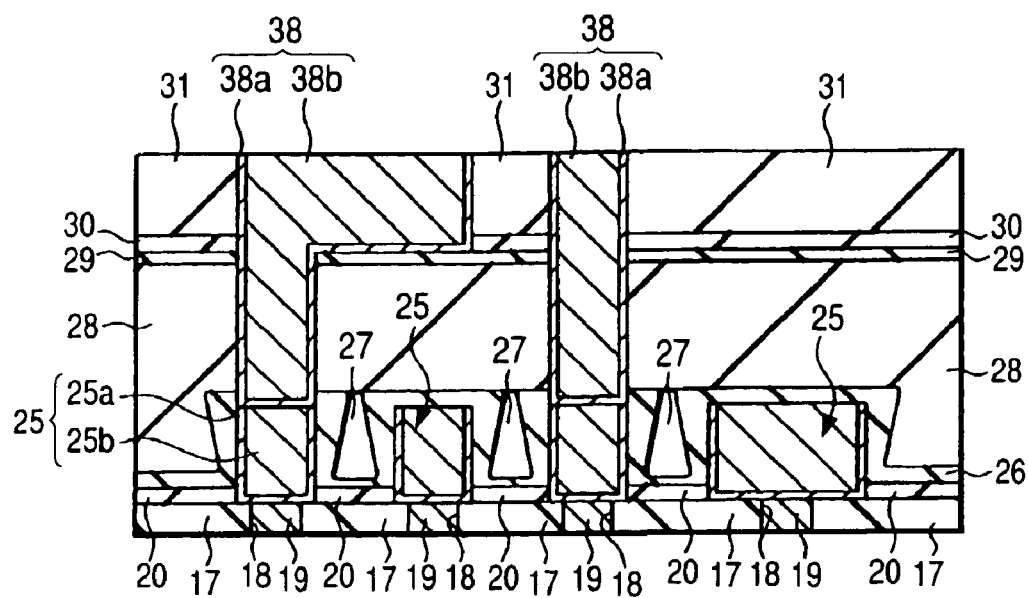
FIG. 25 is a fragmentary cross-sectional view of the semiconductor device during a manufacturing step following that of FIG. 24.

The main conductor film 38b and conductive barrier film 38a are then polished by CMP until the upper surface of the insulating film 31 is exposed, whereby as illustrated in FIG. 25, a third-level interconnect (interconnect) 38 is formed in the interconnect groove made of the opening portions 51 and 53. The third-level interconnect 38 has the relatively thin conductive barrier film 38a and relatively thick main conductor film 38b and is electrically connected to the second-level interconnect 25.

A description on the manufacturing steps thereafter is omitted because they are similar to those of Embodiment 1 following the step of FIG. 17.

Embodiment 3

Figure 26:
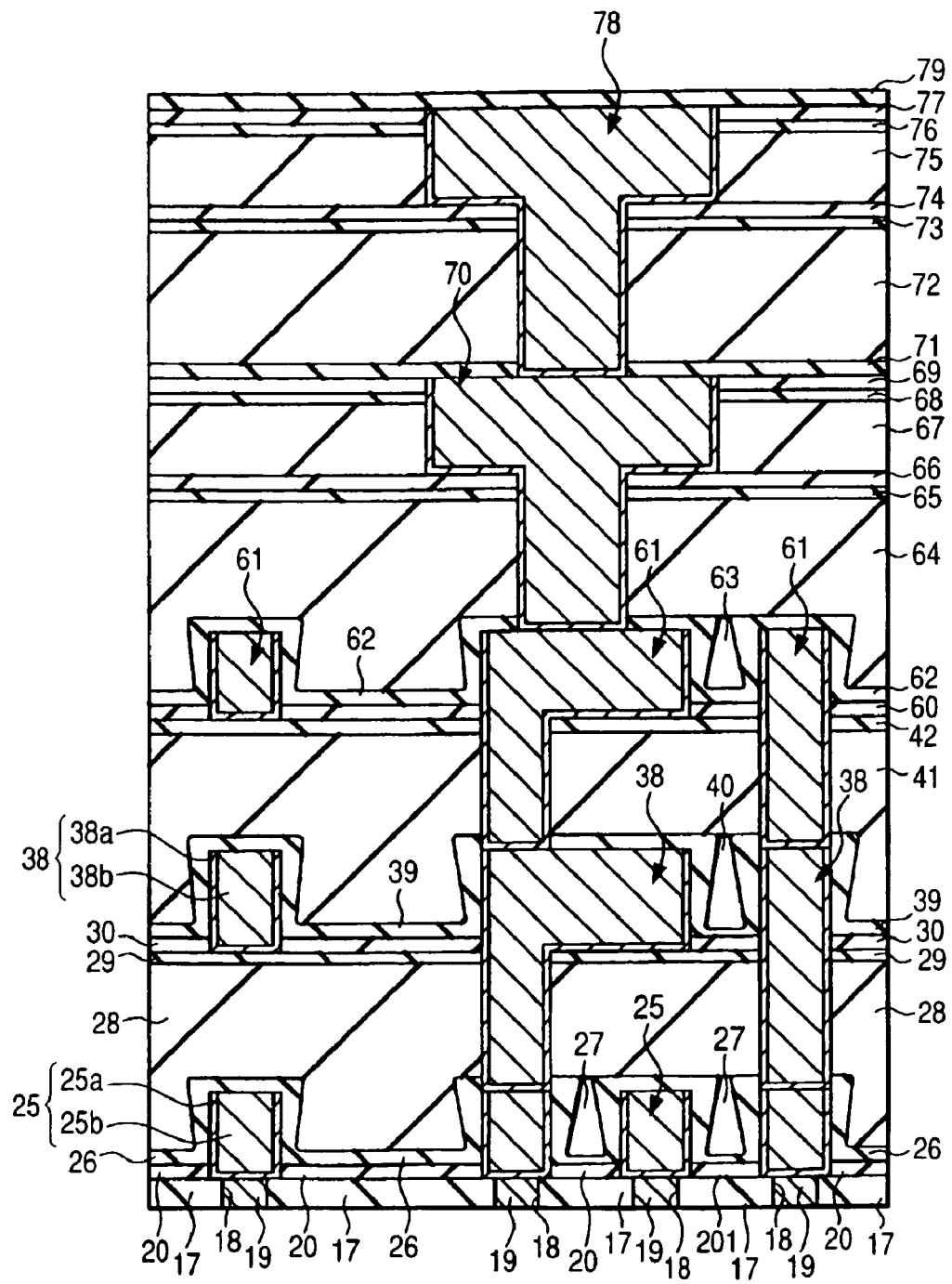
FIG. 26 is a fragmentary cross-sectional view of a semiconductor device according to Embodiment 3 of the present invention during a manufacturing step thereof.

FIG. 26 is a fragmentary cross-sectional view of a semiconductor device according to a further embodiment of the present invention during its manufacturing step. The semiconductor device according to this embodiment has a multilevel interconnect structure having, in combination, an interconnect layer in which a void is formed between two adjacent interconnects and moreover, two adjacent interconnects are not connected via a CMP surface as the second-level interconnects 25 or third-level interconnects 36 of Embodiment 1; and an interconnect layer formed by the conventional inlaid interconnect forming technique. In FIG. 26, the manufacturing steps up to the formation step of the insulating film 42 are similar to those illustrated in the drawings up to FIG. 19 in Embodiment 1 so that overlapping description is omitted. The manufacturing steps thereafter will next be described.

In this Embodiment, an insulating film 60 made of silicon oxide is formed over the insulating film 42 and fourth-level interconnects 61 are formed in a similar manner to that employed for the third-level interconnects 38. Then, in a similar manner to that employed for the insulating film 26, an insulating film 62 serving as a barrier insulating film is formed, followed by the formation thereover of an insulating film 64 in a similar manner to that employed for the insulating film 28. Also in the fourth-level interconnects 61, a void 63 is formed between the most proximate interconnects as in the second-level interconnects 25 or third-level interconnects 36.

Interconnects of the fifth level or greater level are formed by the conventional inlaid interconnect forming technique, such as dual damascene technique. Described specifically, over the insulating film 64, an insulating film 65 made of a silicon nitride, silicon carbide, silicon carbonitride or silicon oxynitride film (for example, "PE-TMS" (product of Canon)", an insulating film 66 made of silicon oxide, an insulating film 67 made of a Low-K material, an insulating film 68 made of a similar material to that of the insulating film 65, for example, silicon nitride and an insulating film 69 made of silicon oxide are formed. Dual damascene technique is then employed for the formation of fifth-level interconnects 70 buried in the interconnect grooves formed in the insulating films 62, and 64 to 69. Over the insulating film 69 including the upper surface of the fifth-level interconnects 70, an insulating film 71 made of a silicon nitride, silicon carbide, silicon carbonitride or silicon oxynitride film is formed as a barrier insulating film. Over the insulating film 71, an insulating film 72 made of a Low-K material, an insulating film 73 made of a similar material to that used for the insulating film 65, for example, silicon nitride, an insulating film 74 made of silicon oxide, an insulating film 75 made of a Low-K material, an insulating film 76 made of a similar material to that used for the insulating film 65, for example, silicon nitride, and an insulating film 77 made of silicon oxide are formed. Then, dual damascene technique is employed for the formation of sixth-level interconnects 78 buried in the interconnect grooves formed in the insulating films 71 to 77. Over the insulating film 77 including the upper surface of the sixth-level interconnect 78, an insulating film 79 made of a similar material to that employed for the insulating film 71, for example, silicon nitride is formed as a barrier insulating film.

As the insulating films 28, 41, 64, 67, 72 and 75, a film formed by CVD such as silicon oxide film, FSG (SIOF material) film, SiOC film or porous silicon (Polus-Si) material can be employed alternatively. In this case, it is possible to omit the formation of the insulating films 30, 60, 66, 68, 69, 74, 76 and 77.

In the multilevel interconnect structure, both an increase in the interconnect capacitance and reduction in the TDDB life tend to occur when the distance between two adjacent interconnects is relatively small, in other words, the interconnect pitch is relatively small. In the interconnects apt to suffer an increase in the interconnect capacitance and reduction in the TDDB life, however, this embodiment makes it possible to improve the TDDB life by eliminating a CMP surface between the same-level interconnects and to reduce the interconnect capacitance by forming a void between the most proximate interconnects of the same-level interconnects.

Embodiment 4

FIGS. 27, and 29 to 31 are each a schematic plan view illustrating interconnect patterns of the semiconductor device according to a further embodiment of the present invention. FIG. 28 is a cross-sectional view taken along a line B—B of FIG. 27. A description on the structure and forming steps of these interconnect patterns is omitted, because they are almost similar to those employed for the second-level interconnects 25 or third-level interconnects 36 of the above-described Embodiment 1.

In this Embodiment, a dummy interconnect 82 is disposed around each of the base interconnects 81. The base interconnects 81 are each an interconnect pattern indispensable as an electric circuit of a semiconductor device. The base interconnects 81 correspond to, for example, the above-described second-interconnects 25 or third-level interconnects 38 and are electrically connected to the gate or source•drain of MISFET. The dummy interconnects 82 are formed simultaneously with the base interconnects 81. Although they are conductor patterns having a similar structure to the base interconnects, they are not required as an electric circuit of the semiconductor device. In short, they are conductor patterns which do not function as an interconnect. The dummy interconnects 82 are electrically connected to neither the gate nor source•drain of MISFET but set at ground potential. In this embodiment, a void (not illustrated) is formed not only between the two adjacent base interconnects 81 but also between the base interconnect 81 and dummy interconnect 82. The void is formed as in Embodiment 1. By the disposal of the dummy interconnect 82, a void can be formed on both sides of the base interconnect 81, making it possible to reduce the parasitic capacitance of the base interconnect 81 further. FIGS. 27 to 30 illustrate examples of the formation patterns of the base interconnect 81 and dummy interconnect 82. Any one of the interconnect patterns as illustrated in FIGS. 27 to 30 and the other various interconnect patterns can be formed as needed.

Figure 27:
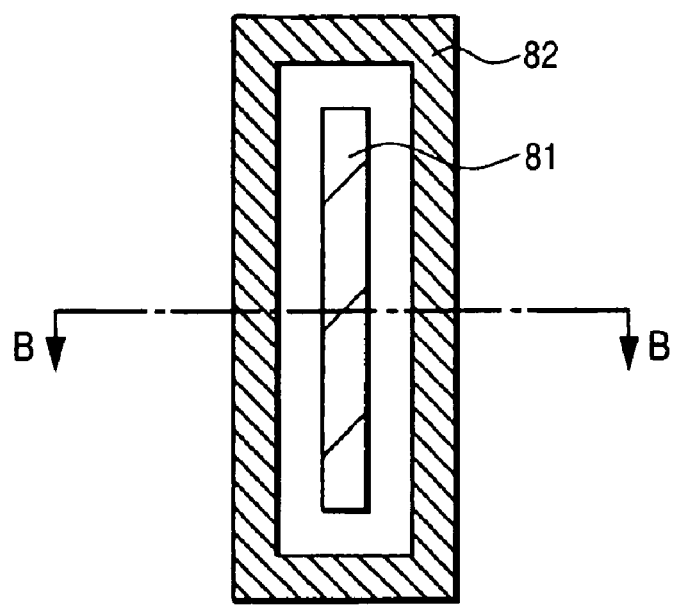
FIG. 27 is a plain view illustrating an interconnect pattern of a semiconductor device according to Embodiment 4 of the present invention.
Figure 28:
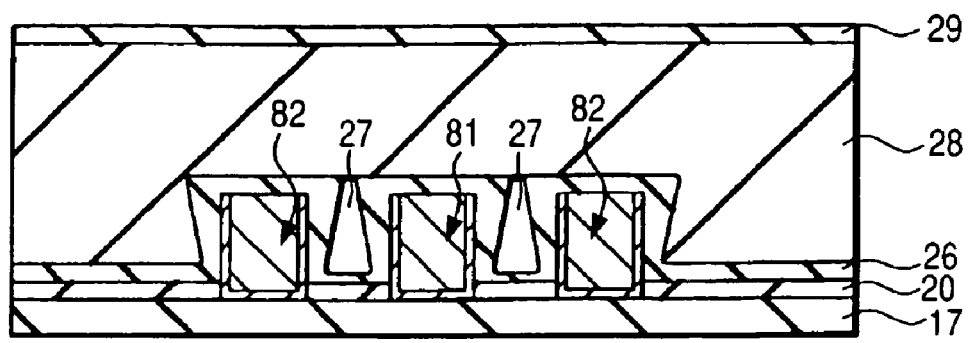
FIG. 28 is a cross-sectional view taken along a line B—B of FIG. 27.

For example, as illustrated in FIGS. 27 and 28, the dummy interconnect 82 can be disposed to surround therewith one isolated base interconnect 81.

Figure 29:
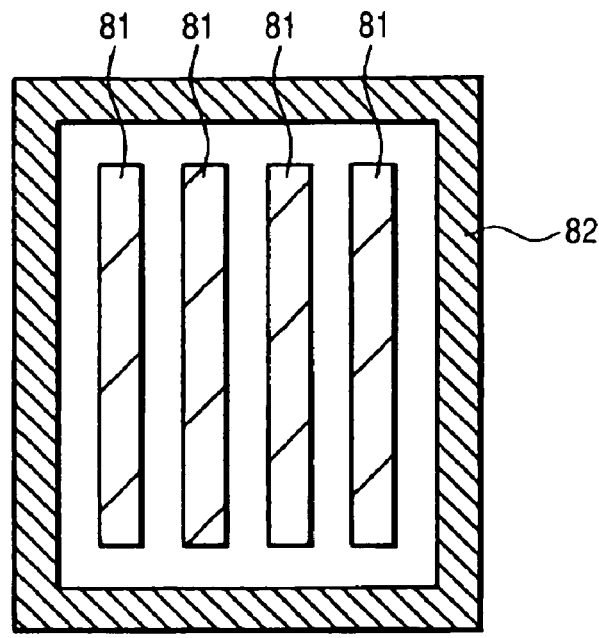
FIG. 29 is a plain view illustrating another interconnect pattern of the semiconductor device according to Embodiment 4 of the present invention.

As illustrated in FIG. 29, the dummy interconnect 82 can be disposed to surround a plurality of base interconnects 81 arranged in parallel each other.

Figure 30:
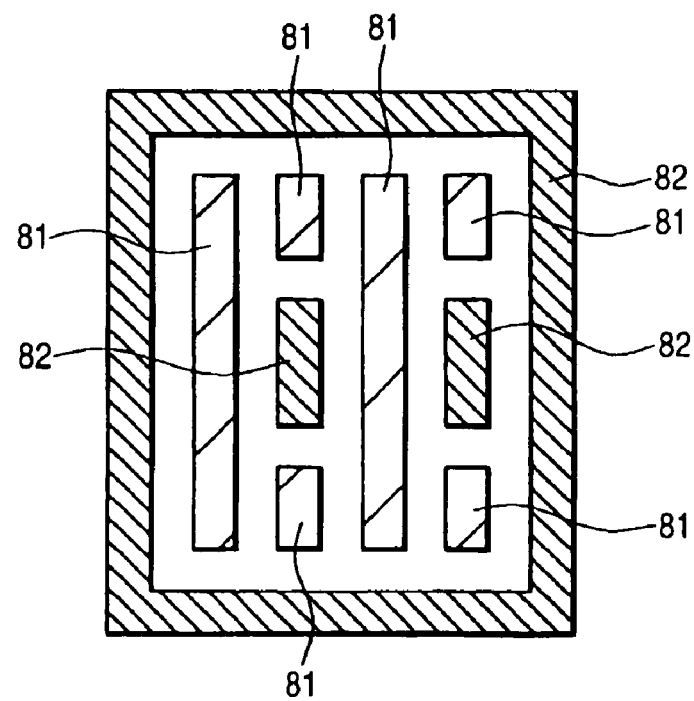
FIG. 30 is a plain view illustrating a further interconnect pattern of the semiconductor device according to Embodiment 4 of the present invention.

As illustrated in FIG. 30, the dummy interconnect 82 can be disposed to surround therewith a plurality of base interconnect 81 arranged in parallel each other and at the same time, another dummy interconnect 82 can be disposed between a plurality of base interconnects 81.

Figure 31:
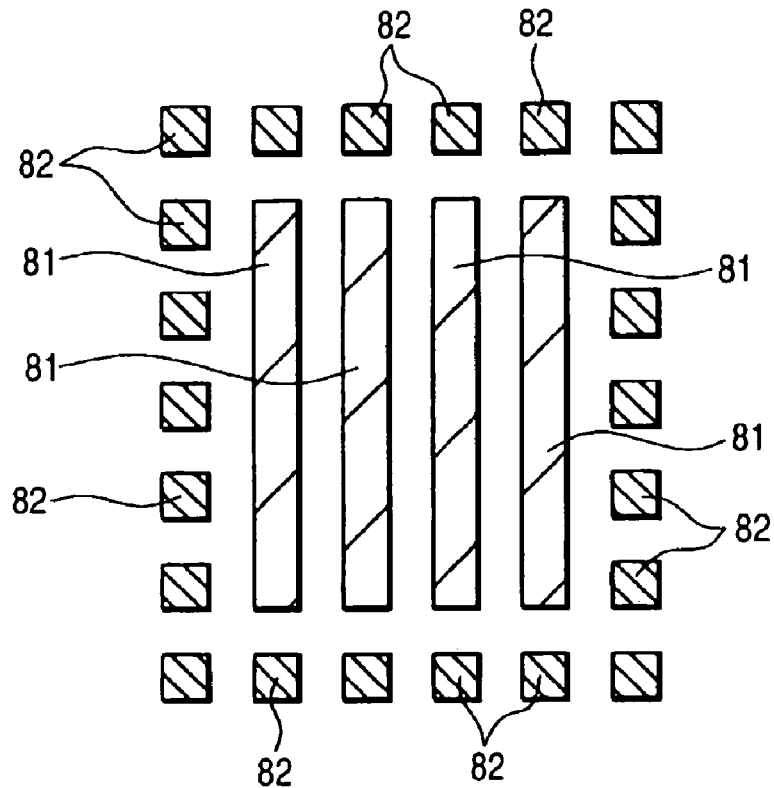
FIG. 31 is a plain view illustrating a still further interconnect pattern of the semiconductor device according to Embodiment 4 of the present invention.

It is not necessary to form the dummy interconnect 82 patterns continuously. For example, as illustrated in FIG. 31, discontinuous dummy interconnects 82 can be disposed.

Embodiment 5

Figure 32:
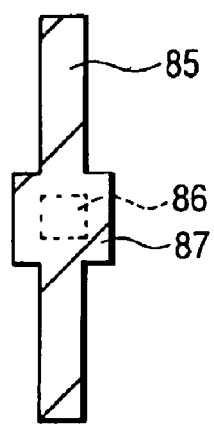
FIG. 32 is a plain view illustrating an interconnect pattern of a semiconductor device according to Embodiment 5 of the present invention.

FIG. 32 is a schematic plan view illustrating interconnect patterns of a semiconductor device according to a further embodiment of the present invention. The interconnect patterns 85 of FIG. 32 correspond to, for example, the above-described second-level interconnects 25 or third-level interconnects 36. Structure and formation step of the interconnect patterns 85 are similar to those of Embodiment 1 so that a description on them are omitted here.

In this embodiment, the interconnect patterns 85 each has a partially widened portion or reservoir portion 87 in the vicinity of a through-hole formation region 86 in order to prevent misalignment of the through-hole from the interconnect pattern. In FIG. 32, a position 86 corresponding to the through-hole to be formed thereover is shown by a dotted line. Upon photolithography for the formation of the through-hole, the through-hole actually formed is sometimes not placed at the desired position (position shown by a dotted line of FIG. 32) owing to misalignment of a photomask. Even in such a case, disposal of the reservoir portion 87 having a broad interconnect width prevents the through-hole from deviating from the interconnect pattern 85. It is therefore possible to prevent, without failure, exposure of the void (not illustrated) formed contiguous to the interconnect 85 during the formation step of the through-hole.

Embodiment 6

Figure 33:
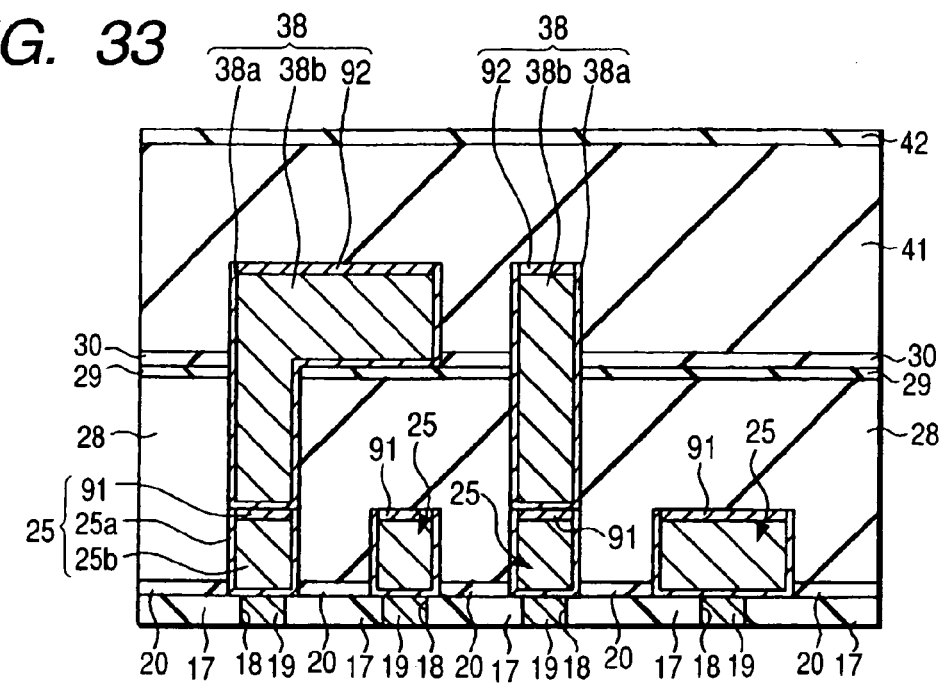
FIG. 33 is a fragmentary cross-sectional view of a semiconductor device according to Embodiment 6 of the present invention during a manufacturing step thereof.

FIG. 33 is a fragmentary cross-sectional view of a semiconductor device according to a still further embodiment of the present invention during its manufacturing step and it corresponds to the stage of the step illustrated in FIG. 19.

Different from Embodiment 1, the insulating films 26 and 39 functioning as a barrier insulating film for a copper interconnect are not formed in this Embodiment. In this embodiment, over the second-level interconnects 25 and third-level interconnects 38 which are copper interconnects, metal cap films 91 and 92 made of, for example, tungsten are formed as a conductive barrier film for preventing copper diffusion. Accordingly, the second-level interconnects 25 are each formed of the conductive barrier film 25a, main conductor film 25b and metal cap film 91, while the third-level interconnects 38 are each formed of the conductive barrier film 38a, main conductor film 38b and metal cap film 92. Since neither the insulating film 26 nor the insulating film 39 is formed, insulating films 28 and 39, each made of a Low-K material, completely fill between two adjacent interconnects of the second-level interconnects 25 and those of the third-level interconnects 36, respectively and even the most proximate interconnects are free of voids 27 and 40 therebetween.

The metal cap film 91 can be formed by selective tungsten CVD. Described specifically, the metal cap film 91 is formed by forming the second-level interconnects 25 embedded in the interconnect grooves as shown in FIG. 5, and then selectively forming a tungsten film, by CVD using tungsten hexafluoride ($WF_6$) and hydrogen ($H_2$) gas, over the second-level interconnects exposed from the insulating film 21. Then, the insulating film 21 is removed. Without forming a barrier insulating film 26, an insulating film 28 is formed to cover the second-level interconnects 25 and to embed between two adjacent interconnects. The metal cap film 92 can be formed in a similar manner to that employed for the metal cap film 91. As the metal cap films 91 and 92, refractory metals other than tungsten or nitrides of a refractory metal such as titanium nitride (TiN) or tantalum nitride (TaN) capable of functioning as a barrier film can be employed. The other structure and manufacturing step of this embodiment are almost similar to those of Embodiment 1 so that a detailed description is omitted.

According to this Embodiment, in the second-level interconnects 25 and third-level interconnects 38 as copper interconnects, the bottom surface and side surfaces of the main conductor films 25b and 38b made of copper are covered with the conductive barrier films 25a and 38a made of, for example, titanium nitride, and the upper surface of the main conductor films 25b and 38b are covered with the metal cap films 91 and 92 made of, for example, tungsten. It is therefore unnecessary to form a barrier insulating film for the second-level interconnects 25 and third-level interconnects 38. Without a CMP surface between the same-level interconnects, it is possible to improve the TDDB life and improve the dielectric breakdown strength between the interconnects. This leads to heightening of the reliability of the semiconductor device. Moreover, it is possible to reduce the interconnect capacitance, because a space between the two adjacent interconnects of the same level can be embedded with only a Low-K material film.

Embodiment 7

Figure 34:
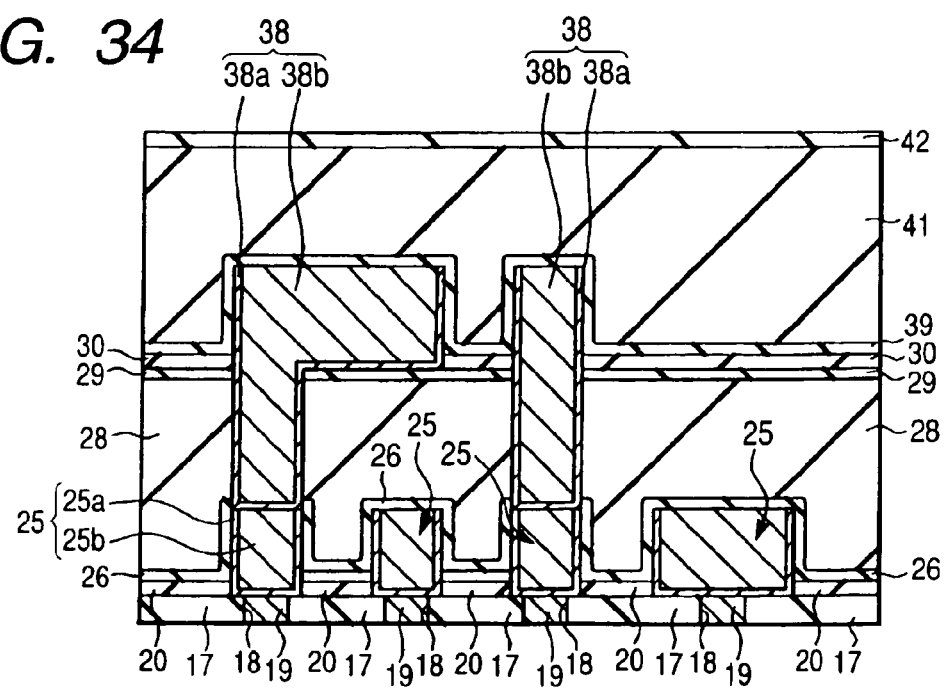
FIG. 34 is a fragmentary cross-sectional view of a semiconductor device according to Embodiment 7 of the present invention during a manufacturing step thereof.

FIG. 34 is a fragmentary cross-sectional view of a semiconductor device according to a still further embodiment of the present invention during its manufacturing step and it corresponds to the stage of the step of FIG. 19.

Different from Embodiment 1, the insulating films 26 and 39 serving as a barrier insulating film for a copper film are formed conformal to the second-level interconnects 25 and third-level interconnects 38 in this embodiment. Described specifically, the insulating films 26 and 39 have shapes reflecting the shapes of the second-level interconnects 25 and third-level interconnects 38, respectively and in any region, the film thickness is almost even. The concave portion 27d of the insulating film 26 is substantially same in the size of the frontage and in the size inside of the concave portion 27d. The insulating film 28 is therefore formed to embed the concave portion 27d of the insulating film 26 with a Low-K material constituting the insulating film 28. Even between the most proximate interconnects of the second-level interconnects 25, no void is formed but a Low-K material is embedded. This also applies to the third-level interconnects 38. This embodiment is similar to Embodiment 1 in the structure and manufacturing step other than those described above so that detailed description is omitted here.

According to this embodiment, since no CMP surface exists between the same-level interconnects, it is possible to improve the TDDB life and dielectric breakdown strength between interconnects. This leads to heightening of the reliability of the semiconductor device. Moreover, it is possible to reduce the interconnect capacitance because a space between the two adjacent interconnects of the same level is embedded with only a Low-K material film.

Embodiment 8

Figure 35:
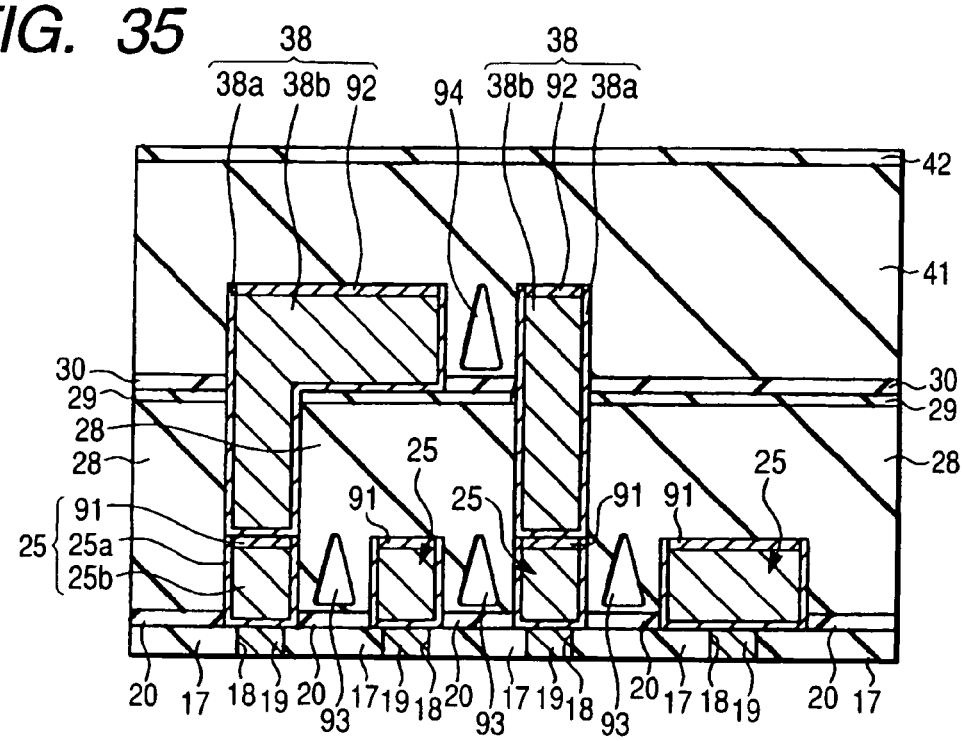
FIG. 35 is a fragmentary cross-sectional view of a semiconductor device according to Embodiment 8 of the present invention during a manufacturing step thereof.

FIG. 35 is a fragmentary cross-sectional view of a semiconductor device according to a still further embodiment of the present invention during its manufacturing step and it corresponds to the stage of the step of FIG. 19.

In this embodiment, similar to Embodiment 6, the insulating films 26 and 39 serving as a barrier insulating film for a copper film are not formed and over the second-level interconnects 25 and third-level interconnects 38, metal cap films 91 and 92 made of, for example, tungsten are formed as a conductive barrier film for preventing copper diffusion. The second-level interconnects 25 therefore have the conductive barrier film 25a, main conductor film 25b and metal cap film 91, while the third-level interconnects 38 have the conductive barrier film 38a, main conductor film 38b and metal cap film 92.

In this embodiment different from the above-described Embodiment 6, however, voids 93 and 94 are formed between the two adjacent interconnects, for example, the most proximate interconnects, of the second-level interconnects 25 and those of the third-level interconnects 38 respectively. The void 93 can be formed, for example, in the following manner. Upon formation of the insulating film 28 over the insulating film 20 to cover the second-level interconnects 25, an insulating film 28 is formed under the conditions so that the coverage between the most proximate interconnects overhangs as in the formation step of the insulating film 26 in Embodiment 1. Formation of the insulating film 28 is continued until it has a predetermined thickness, by which the void 93 is formed in the insulating film 28 between the most proximate interconnects. The void 94 can be formed in a similar manner to that employed for the void 93. It is therefore preferred to make the insulating films 28 and 41 from a Low-K material to which CVD can be applied and an FSG (SiOF material) film, SiOC film or porous silicon (Polus-Si) material film formed by CVD can be used for example. Alternatively, a silicon oxide film formed by CVD is usable. This embodiment is almost similar to Embodiment 1 in the other structure and manufacturing step so that a detailed description is omitted.

According to this embodiment, in the second-level interconnects 25 and third-level interconnects 38 as copper interconnects, the bottom surface and side surfaces of the main conductor films 25b and 38b made of copper are covered with the conductive barrier films 25a and 38a made of, for example, titanium nitride and the upper surface of the main conductor films 25b and 38b are covered with the metal cap films 91 and 92 made of, for example, tungsten. It is therefore unnecessary to form a barrier insulating film for the second-level interconnects 25 and third-level interconnects 38. Without a CMP surface between the same-level interconnects, it is possible to improve the TDDB life and dielectric breakdown strength between the interconnects. This leads to heightening of the reliability of the semiconductor device. Moreover, it is possible to form a void between the most proximate interconnects in the same-level interconnects which need a reduction in capacitance most and embed regions other than the void with only a Low-K material, whereby the interconnect capacitance can be reduced.

Embodiment 9

Figure 36:
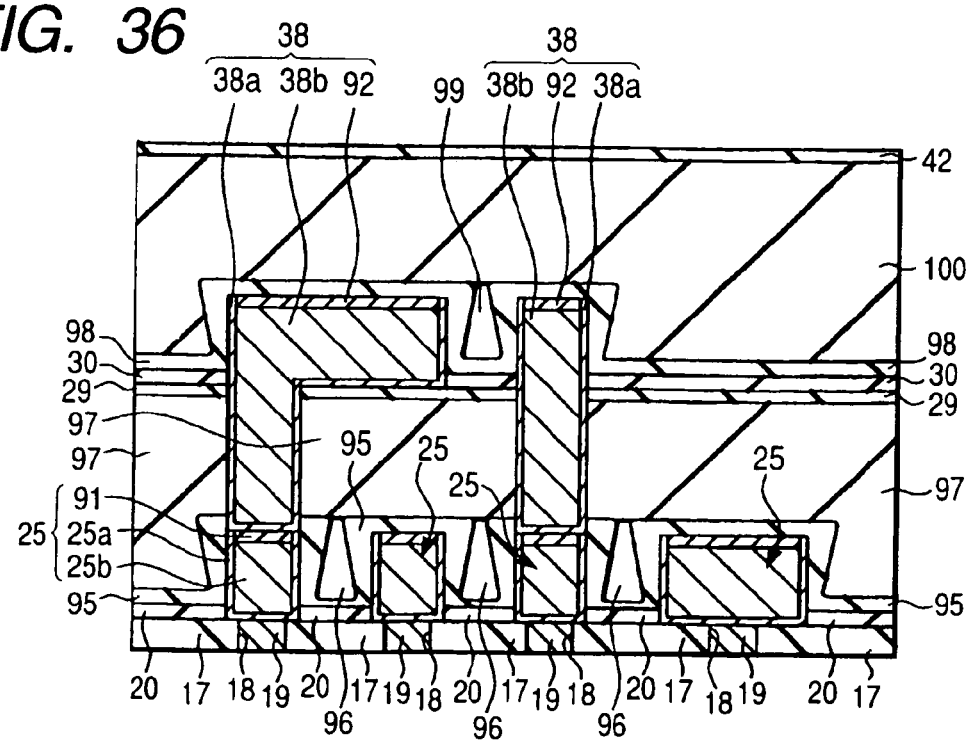
FIG. 36 is a fragmentary cross-sectional view of a semiconductor device according to Embodiment 9 of the present invention during a manufacturing step thereof.

FIG. 36 is a fragmentary cross-sectional view of a semiconductor device according to a still further aspect of the present invention and it corresponds to the stage of the step of FIG. 19.

In this embodiment similar to Embodiments 6 and 8, without forming the insulating films 26 and 39 serving as a barrier insulating film for a copper film, metal cap films 91 and 92 made of, for example, tungsten are formed over the second-level interconnects 25 and third-level interconnects 38 as a conductive barrier film for preventing copper diffusion. Accordingly, the second-level interconnects 25 each has the conductive barrier film 25a, main conductor film 25b and metal cap film 91, while the third-level interconnects 38 each has the conductive barrier film 38a, main conductor film 38b and metal cap film 92.

In this embodiment different from the above-described Embodiment 6, voids 96 and 99 are formed between the two adjacent interconnects, for example, the most proximate interconnects of the second-level interconnects 25 and those of the third-level interconnects 38 respectively. The void 96 can be formed, for example, in the following manner.

The insulating film 95 is formed by CVD over the insulating film 20 to cover the second-level interconnects 25. The insulating film 95 is preferably made of a Low-K material to which CVD can be applied, and an FSG (SIOF material) film, SiOC film or porous silicon (Polus-Si) material film formed by CVD can be used for example. Alternatively, a silicon oxide film formed by CVD is usable. At this time, the insulating film 95 is formed under the conditions so that the coverage between the most proximate interconnects overhang, as in the formation step of the insulating film 26 in Embodiment 1, whereby the insulating film 95 has a concave portion similar to the concave portion 27a of Embodiment 1 between the most proximate interconnects of the second-level interconnects 25. Then, an insulating film 97 is formed over the insulating film 95 by the coating method or the like. The insulating film 97 is preferably made of a Low-K material to which the coating method can be applied, but it may be made of a Low-K material for which the method other than the coating method is adopted. As in the formation step of the insulating film 28 in Embodiment 1, surface tension of the material for the insulating film 97 prevents it from entering inside of the concave portion between the most proximate interconnects of the second-level interconnects 25. In this Embodiment, as in Embodiment 1, a void 96 surrounded by the insulating films 95 and 97 are formed between the most proximate interconnects of the second-level interconnects 25.

The void 99 can be formed in a similar manner to that employed for the void 96. Described specifically, an insulating film 98 made of a similar material to that of the insulating film 95 and an insulating film 100 made of a similar material to that of the insulating film 97 are formed in this order and between the most proximate interconnects of the third-level interconnects 38, the void 99 surrounded by the insulating films 98 and 100 are formed. This embodiment is almost similar to Embodiment 1 in the other structure and manufacturing step so that a detailed description is omitted here.

According to this embodiment, in the second-level interconnects 25 and third-level interconnects 38 as copper interconnects, the bottom surface and side surfaces of the main conductor films 25b and 38b made of copper are covered with the conductive barrier films 25a and 38a made of, for example, titanium nitride and the upper surface of the main conductor films 25b and 38b is covered with the metal cap films 91 and 92 made of, for example, tungsten. It is therefore unnecessary to form a barrier insulating film for the second-level interconnects 25 and third-level interconnects 38. Without a CMP surface between the same-level interconnects, it is possible to improve both the TDDB life and the dielectric breakdown strength between the interconnects. This leads to heightening of the reliability of the semiconductor device. Moreover, it is possible to form a void between the most proximate interconnects of the same-level which need a reduction in capacity most and to embed regions other than the void with only a Low-K material film, whereby the interconnect capacitance can be reduced.

The inventions made by the present inventors were so far described based on their embodiments. It should however be borne in mind that the present invention is not limited to the above-described embodiments, but be modified within an extent not departing the gist of the invention.

In the above embodiments, the description was made on a semiconductor device having CMISFET. The present invention is not limited thereto, but can be applied to various semiconductor devices equipped with interconnects having a main conductor film composed mainly of copper.

Among the inventions disclosed by the present application, advantages available by the typical ones will next be described briefly.

It is possible to improve the dielectric breakdown strength between interconnects having copper as a main conductor layer.

It is also possible to reduce the capacitance between interconnects having copper as a main conductor layer.

What is claimed is:

1. A semiconductor device, comprising:
   a semiconductor substrate;
   a first insulating film formed thereover;
   interconnects formed over the first insulating film and having copper as a main component;
   a second insulating film formed over an upper surface and side surfaces of each of the interconnects and over the first insulating film, and having a function of suppressing or preventing copper diffusion; and
   a third insulating film formed over the second insulating film and having a dielectric constant lower than that of the second insulating film,
   wherein the second insulating film includes a first portion formed beside upper portions of the interconnects and a second portion formed over the first insulating film, and
   wherein a thickness of the first portion is thicker than a thickness of the second portion.

2. A semiconductor device according to claim 1, wherein a void is formed between two adjacent interconnects of the interconnects.

3. A semiconductor device according to claim 2, wherein the void is formed between most proximate interconnects of the interconnects.

4. A semiconductor device according to claim 1, wherein a void surrounded by the second insulating film and the third insulating film is formed between two adjacent interconnects of the interconnects.

5. A semiconductor device according to claim 1, wherein a void is formed in the second insulating film filling a space between two adjacent interconnects of the interconnects.

6. A semiconductor device comprising a plurality of interconnect layers formed over a semiconductor substrate,
   at least one of the plurality of interconnect layers including:
   a first interconnect formed over a first insulating film and having copper as a main component;
      a second insulating film formed over an upper surface and side surfaces of the first interconnect and over the first insulating film, and having a function of suppressing or preventing copper diffusion; and
      a third insulating film formed over the second insulating film and having a dielectric constant lower than that of the second insulating film,
      wherein a void is formed between two adjacent interconnects of the first interconnects, and
   wherein the second insulating film includes a first portion formed beside an upper portion of the first interconnect and a second portion formed over the first insulating film, and
   wherein a thickness of the first portion is thicker than a thickness of the second portion.

7. A semiconductor device according to claim 6, wherein at least one interconnect layer, among the plurality of interconnect layers, includes:
   a fourth insulating film having opening portions;
   second interconnects formed to embed the opening portions and having copper as a main component;
   a fifth insulating film formed over the fourth insulating film and the interconnects, and having a function of suppressing or preventing copper diffusion; and
   a sixth insulating film formed over the fifth insulating film and having a dielectric constant lower than that of the fifth insulating film.

8. A semiconductor device, comprising:
   a semiconductor substrate;
   a first insulating film formed thereover;
   interconnects formed over the first insulating film and having copper as a main component;
   a conductor portion disposed over the first insulating film to be contiguous to the interconnects;
   a second insulating film formed over an upper surface and side surfaces of each of the interconnects, an upper surface and side surfaces of the conductor portion, and over the first insulating film, and having a function of suppressing or preventing copper diffusion; and a third insulating film formed over the second insulating film and having a dielectric constant lower than that of the second insulating film, wherein a void is formed between the interconnects and the conductor portion, wherein the second insulating film includes a first portion formed beside an upper portion of the interconnects, a second portion formed beside an upper portion of the conductor portion, and a third portion formed over the first insulating film and wherein a thickness of the first portion and a thickness of the second portion are thicker than a thickness of the third portion.

9. A semiconductor device according to claim 8, wherein the conductor portion is formed of the same material as the interconnects and is a conductor pattern which does not function as an interconnect of the semiconductor device.

* * * * *